US012750060B2

(12) United States Patent
Kim et al.

(10) Patent No.: US 12,750,060 B2
(45) Date of Patent: Sep. 29, 2026

(54) MEMORY DEVICE AND STORAGE DEVICE INCLUDING THE SAME

(71) Applicant: Samsung Electronics Co., Ltd., Suwon-si (KR)

(72) Inventors: Tongsung Kim, Suwon-si (KR); Hyeseong Shin, Suwon-si (KR); Hyunwoo Ahn, Suwon-si (KR); Seonkyoo Lee, Suwon-si (KR); Hyunsung Lee, Suwon-si (KR); Daechul Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 63 days.

(21) Appl. No.: 18/897,676

(22) Filed: Sep. 26, 2024

(65) Prior Publication Data

US 2025/0119149 A1 Apr. 10, 2025

(30) Foreign Application Priority Data

Oct. 5, 2023 (KR) ........................ 10-2023-0132511

(51) Int. Cl.

| | |
|---|---|
| ***H03L 7/081*** | (2006.01) |
| ***G11C 7/10*** | (2006.01) |
| ***H03L 7/085*** | (2006.01) |
| ***H03L 7/195*** | (2006.01) |

(52) U.S. Cl.

CPC .......... *H03L 7/0818* (2013.01); *G11C 7/1069* (2013.01); *H03L 7/085* (2013.01); *H03L 7/195* (2013.01)

(58) Field of Classification Search

None

See application file for complete search history.

(56) References Cited

U.S. PATENT DOCUMENTS

| | | | | |
|---|---|---|---|---|
| 7,368,966 | B2 | 5/2008 | Hur | |
| 7,961,017 | B2 | 6/2011 | Lee | |
| 8,644,085 | B2 | 2/2014 | Kim et al. | |
| 10,063,222 | B1 | 8/2018 | Arp et al. | |
| 11,244,711 | B2 | 2/2022 | Tsuji | |
| 11,349,457 | B2 | 5/2022 | Kim et al. | |
| 11,973,506 | B2 * | 4/2024 | Satoh | G11C 11/4076 |
| 2022/0140832 | A1 | 5/2022 | Song et al. | |
| 2023/0118731 | A1 | 4/2023 | Balasubrahmanyam et al. | |

* cited by examiner

*Primary Examiner* — Kenneth B Wells

(74) *Attorney, Agent, or Firm* — Wolf, Greenfield & Sacks, P.C.

(57) ABSTRACT

A memory chip performs phase calibration and duty cycle correction operations using first and second loop circuits. The first loop circuit includes a phase detector, a first counter, and a delay cell. The second loop circuit includes a phase generator, the phase detector, a second counter, and a duty correction circuit (DCC).

20 Claims, 15 Drawing Sheets

MEMORY DEVICE AND STORAGE DEVICE INCLUDING THE SAME

REFERENCE TO PRIORITY APPLICATION

This application claims priority under 35 U.S.C. § 119 to Korean Patent Application No. 10-2023-0132511, filed Oct. 5, 2023, the disclosure of which is hereby incorporated herein by reference.

BACKGROUND

The inventive concept relates to integrated circuit devices and, more particularly, to integrated circuit memory devices that support phase calibration and duty correction operations, and storage systems and devices having the memory devices therein.

A storage device may include a nonvolatile memory and a controller configured to control the nonvolatile memory. Conventionally, communication between nonvolatile memories and controllers may be performed at a lower operating frequency than communication in memory systems including high-speed memory such as dynamic random-access memory (DRAM) or static random-access memory (SRAM). However, recently, communication between nonvolatile memories and their controllers has been required to be performed at higher operating frequencies.

SUMMARY

The inventive concept provides memory devices that are configured to align phases of signals generated within a memory chip and reduce degradation of signal duty cycles, and storage devices including the memory devices.

According to an aspect of the inventive concept, there is provided a memory device including: a clock pin/pad, which is configured to receive a clock signal from the outside, and a memory chip, which is configured to perform, during a training section, a phase calibration operation and a duty correction operation. The memory chip includes a first loop circuit and a second loop circuit. The first loop circuit includes a phase detector configured to generate a first comparison signal by detecting a phase difference between a first signal and a second signal (received from the outside), a first counter configured to generate a delay signal, based on the first comparison signal, and a delay cell configured to perform the phase calibration operation on the first signal according to the delay signal. The second loop circuit includes: a phase signal generator configured to generate a second reverse signal based on the second signal, and the phase detector is further configured to generate a second comparison signal by comparing a duty cycle of a first reverse signal received from the outside with a duty cycle of the second reverse signal, a second counter configured to generate a control signal, based on the second comparison signal, and a duty cycle correction circuit (DCC) configured to perform the duty correction operation on the second signal according to the control signal.

According to another aspect of the inventive concept, there is provided a storage device including a controller, which is configured to provide a first signal, a second signal, and a first reverse signal, and a memory device, which is configured to perform a phase calibration operation and a duty correction operation. The memory device includes a phase detector configured to detect a phase difference between the first signal and the second signal, a first counter configured to generate a delay signal, based on the phase difference, a delay cell configured to receive the delay signal and perform a phase calibration operation on the first signal, a phase signal generator configured to generate a second reverse signal based on the second signal, a second counter configured to receive the first reverse signal and the second reverse signal and, based on a difference generated by comparing a duty cycle of the first reverse signal with a duty cycle of the second reverse signal, generate a control signal, and a duty correction circuit (DCC) configured to receive the control signal and perform a duty correction operation on the second signal.

According to another aspect of the inventive concept, there is provided a memory device including a plurality of memory chips, and an interface chip configured to perform communication between a controller and the plurality of memory chips. The interface chip includes a first loop circuit, which is configured to perform a phase calibration operation during a training section of the controller, and a second loop circuit, which is configured to perform a duty correction operation during the training section of the controller. The first loop circuit includes: a phase detector and generator configured to detect a phase difference between a first signal and a second signal, which are received from the controller, and generate a first comparison signal, a first counter configured to generate a delay signal, based on the first comparison signal, and a delay cell configured to perform the phase calibration operation on the first signal according to the delay signal. The second loop circuit includes: a phase signal generator configured to generate a second reverse signal based on the second signal, the phase detector and generator is further configured to compare a duty cycle of a first reverse signal received from the controller with a duty cycle of the second reverse signal and generate a second comparison signal, a second counter configured to generate a control signal, based on the second comparison signal, and a duty correction circuit (DCC) configured to perform the duty correction operation on the second signal according to the control signal.

BRIEF DESCRIPTION OF THE DRAWINGS

Embodiments will be more clearly understood from the following detailed description taken in conjunction with the accompanying drawings in which.

DETAILED DESCRIPTION OF EMBODIMENTS

Hereinafter, an embodiment will be described in detail with reference to the accompanying drawings.

Figure 1:
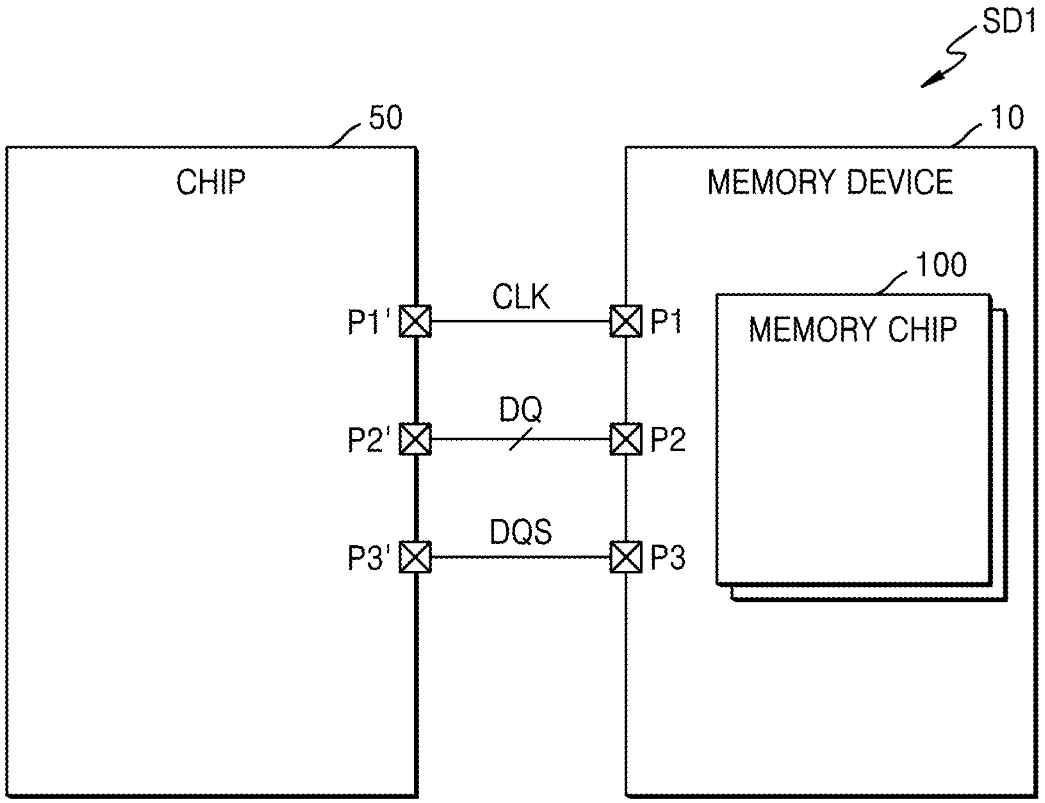
FIGS. 1 and 2 are schematic block diagrams of a storage device according to an embodiment.
Figure 2:
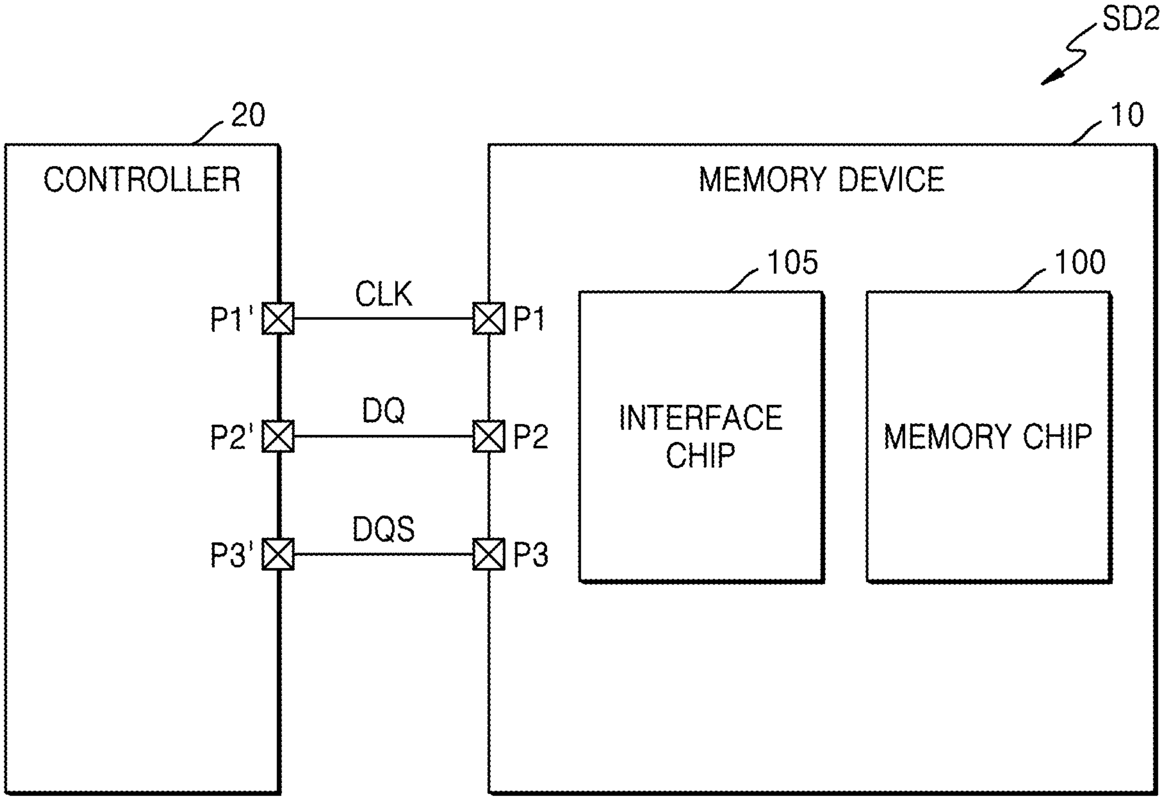

FIGS. 1 and 2 are schematic block diagrams of storage devices SD1 and SD2, according to an embodiment. Referring to FIG. 1, the storage device SD1 may include a memory device 10 and a chip 50. The memory device 10 may include a nonvolatile memory device including a plurality of memory chips 100.

Each of the plurality of memory chips 100 may include a duty cycle correction circuit (hereinafter referred to as a "DCC") 120. According to an embodiment, the chip 50 may correspond to a memory controller chip or a controller chip. According to another embodiment, the chip 50 may correspond to a buffer chip arranged between the memory device 10 and a memory controller. According to an embodiment, the chip 50 may correspond to an additional sensing chip.

The memory device 10 may include the plurality of memory chips 100, and thus, the memory device 10 may be referred to as a "multi-chip memory." In some embodiments, each of the plurality of memory chips 100 may be a dual die package (DDP), a quadruple die package (QDP), or an octal die package (ODP). However, the inventive concept is not limited thereto. According to some embodiments, the plurality of memory chips 100 may correspond to a plurality of memory dies, respectively, and thus, the memory device 10 may be referred to as a "multi-die package."

According to an embodiment, each of the plurality of memory chips 100 may be a nonvolatile memory chip. For example, each of the plurality of memory chips 100 may be a NAND flash memory chip. In some embodiments, at least one of the plurality of memory chips 100 may be a vertical NAND (VNAND) flash memory chip, and the VNAND flash memory chip may include cell strings each including word lines stacked on a substrate in a vertical direction and a plurality of memory cells respectively connected to the word lines. However, the inventive concept is not limited thereto, and at least one of the plurality of memory chips 100 may be a resistive memory chip such as resistive random-access memory (ReRAM), phase change random-access memory (PRAM), and magnetic random-access memory (MRAM).

The memory device 10 and the chip 50 may communicate with each other through a plurality of signal lines including a clock signal line, input and output signal lines, and a data strobe signal line. For example, the memory device 10 and the chip 50 may be realized to comply with the standard protocols, such as Toggle or ONFI. The chip 50 may transmit a clock signal CLK to the memory device 10 through a clock signal line. According to the present embodiment, the clock signal CLK may toggle at a predetermined frequency in a predetermined section, and thus, the storage device SD may be an asynchronous system.

For example, the clock signal CLK may toggle at a frequency corresponding to a data input and output speed. The chip 50 may transmit a command and an address to the memory device 10 through input and output signal lines, and then, data DQ may be transmitted between the chip 50 and the memory device 10 through the input and output signal lines. Also, a data strobe signal DQS may be transmitted between the chip 50 and the memory device 10 through a data strobe signal line. Here, the signal lines through which the clock signal CLK, the data DQ, and the data strobe signal DQS are transmitted and received may form a channel.

The memory device 10 may include a clock pin P1 connected to the clock signal line, input and output pins P2 respectively connected to the input and output signal lines, and a data strobe pin P3 connected to the data strobe signal line, and the plurality of memory chips 100 may be commonly connected to each of the clock pin P1, the input and output pins P2, and the data strobe pin P3. The chip 50 may include a clock pin P1', input and output pins P2', and a data strobe pin P3' respectively connected to the clock pin P1, the input and output pins P2, and the data strobe pin P3. The input and output pins P2 may include 8 input and output pins. However, the inventive concept is not limited thereto. In addition, the term "pin" may be used interchangeably with the term "pad" and these terms have coextensive meaning to one of ordinary skill in the art.

During a read operation on the memory device 10, the memory device 10 may receive the clock signal CLK, for example, a read enable signal nRE, and may output the data strobe signal DQS and the data DQ. In a double data rate (DDR) mode, the data DQ may be sequentially output in synchronization with consecutive rising and falling edges of the data strobe signal DQS. Thus, data windows of first data and second data, which are sequentially output, may correspond to a logic high section and a logic low section of the data strobe signal DQS, respectively. Here, the data strobe signal DQS may be generated based on the clock signal CLK, and thus, the data windows of the first data and the second data may be determined according to a ratio between a logic high section and a logic low section of the clock signal CLK.

When a "duty cycle mismatch" occurs in the clock signal CLK, the logic high section and the logic low section of the clock signal CLK may be different from each other, in other words, a ratio between the logic high section and the logic low section, that is, a duty cycle ratio, may not be 1:1. Here, the first and second data may have different data windows from each other (as a result of the duty cycle mismatch), and valid data windows of the first and second data may be reduced, and thus, the memory device 10 may have performance degradation. Thus, a method of obtaining valid data windows by performing a duty cycle correction operation on the clock signal CLK in order to resolve the duty cycle mismatch of the clock signal CLK is required.

The memory device 10 is an asynchronous system and does not have a frequency at which the memory device 10 always toggles, and thus, the DCCs 120 may perform a duty cycle correction operation only in a section in which the clock signal CLK is applied. According to an embodiment, the memory device 10 may perform the duty cycle correction operation by using a read enable signal nRE as the clock signal CLK. In particular, during a read section, when a read operation on the memory device 10 is being performed, the duty cycle correction operation is performed in a read-out section in which read data is output, a clock duty cycle may be changed for each clock cycle due to the duty cycle correction operation, such that valid data windows of the read data may be reduced.

Thus, according to an embodiment, the DCCs 120 may perform the duty cycle correction operation in a dedicated section rather than the read-out section. Hereinafter, the dedicated section for the duty cycle correction operation may be referred to as a "DCC training section," and operations performed by the DCCs 120 in the DCC training section may be referred to as "DCC training." According to an embodiment, the "DCC training section" may include a predetermined number of clock cycles. During the DCC training section, the clock signal CLK, for example, the read enable signal nRE may toggle at a predetermined frequency.

The aspects described above with reference to FIG. 1 may be applied to the embodiment illustrated in FIG. 2, and descriptions of the same aspects as FIG. 1 are omitted. Referring to FIG. 2, the storage device SD2 may include the memory device 10 and a controller 20, and the memory device 10 may include the memory chip 100 and an interface chip 105. The interface chip 105 may relay communication between the controller 20 and the plurality of memory chips 100. According to an embodiment, the interface chip 105 may transmit a command signal, an address signal, etc., received from the controller 20, to at least one of the plurality of memory chips 100.

A program operation of storing data in the controller 20 and the memory device 10 and/or a read operation of reading data stored in a memory package may be performed in synchronization with a predetermined clock signal CLK. As a data rate between the controller 20 and the memory device 10 increases, it may be necessary to accurately align phases of a data signal and a clock signal exchanged between the controller 20 and the memory device 10.

According to an embodiment, when a skew occurs in a phase difference between the data signal and the clock signal between the controller 20 and the interface chip 105 and/or between the interface chip 105 and the plurality of memory chips 100, the reliability of the storage device SD2 may be degraded. Also, when the controller 20 is not able to determine whether the interface chip 105 is included in the memory chip 10, only the skew between the controller 20 and the interface chip 105 may be minimized in a training operation performed after power is supplied to the storage device SD2. In this case, the skew between the interface chip 105 and the plurality of memory chips 100 may increase, and thus, problems may occur in operation in the memory device 10.

According to an embodiment, after power is supplied to the storage device SD2, phases of a data signal and a clock signal may be aligned in internal channels between the interface chip 105 and the plurality of memory chips 100 in order to reduce skews. Alternatively, the phases of the data signal and the clock signal may be aligned in the internal channels of the memory device 10 during a training operation performed, on the memory device 10, by the controller 20, and thus, it is possible to minimize skews occurring in the internal channels of the memory device 10 without an additional training time.

However, according to an embodiment, the memory device 10 may form a phase calibration operation loop and a duty cycle correction operation loop, and thus, may reduce degradation of the duty cycle.

Referring to FIGS. 1 and 2 again, according to some embodiments, the storage devices SD1 and SD2 may be internal memories embedded in an electronic device. For example, the storage devices SD1 and SD2 may include solid state disks (SSDs), embedded universal flash storage (UFS) memory devices, or embedded multi-media cards (eMMCs). According to some embodiments, the storage devices SD1 and SD2 may be external memories detachable from an electronic device. For example, the storage devices SD1 and SD2 may include UFS memory cards, compact flash (CF), secure digital (SD), micro-SD, mini-SD, extreme digital (xD), or memory sticks.

Figure 3:
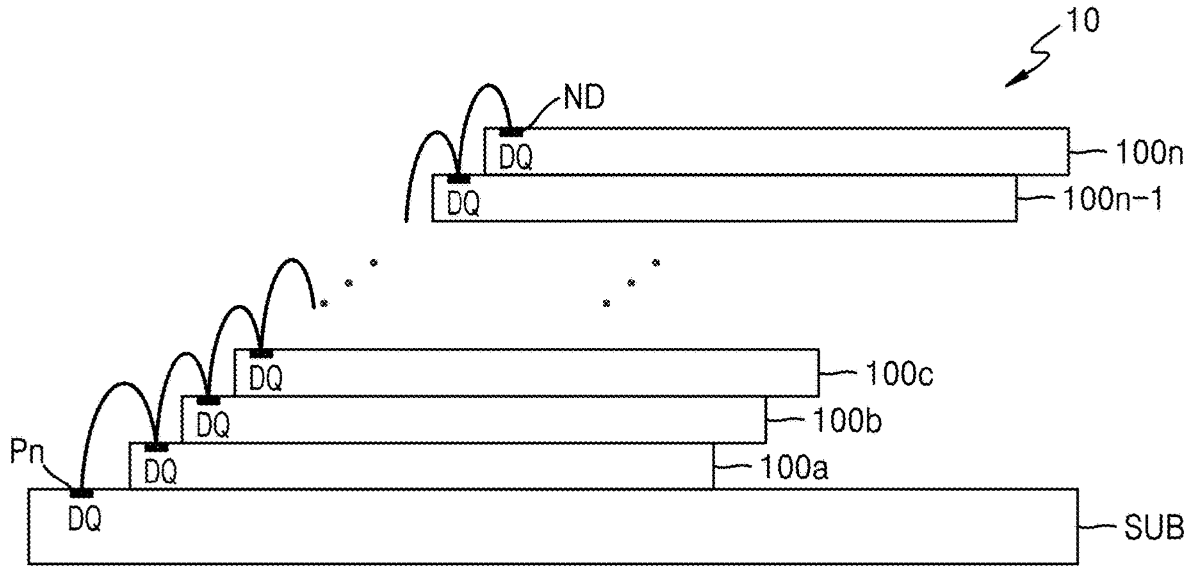
FIG. 3 is a side view diagram of a memory device of FIG. 1.

FIG. 3 illustrates the memory device 10 of FIG. 1. Referring to FIG. 3, the memory device 10 may include a substrate SUB and first to $n^{th}$ memory chips 100*a* to 100*n* (n is a positive integer). The first to $n^{th}$ memory chips 100*a* to 100*n* may be vertically stacked on the substrate SUB. An input and output pin Pn may be arranged on the substrate SUB, and input and output nodes ND of the first to $n^{th}$ memory chips 100*a* to 100*n* may be connected to the input and output pin Pn. For example, the input and output pin Pn and the input and output nodes ND may be connected to each other through wire bonding, and here, for the wire bonding, the first to $n^{th}$ memory chips 100*a* to 100*n* may be stacked in a horizontal direction with skews.

Figure 4:
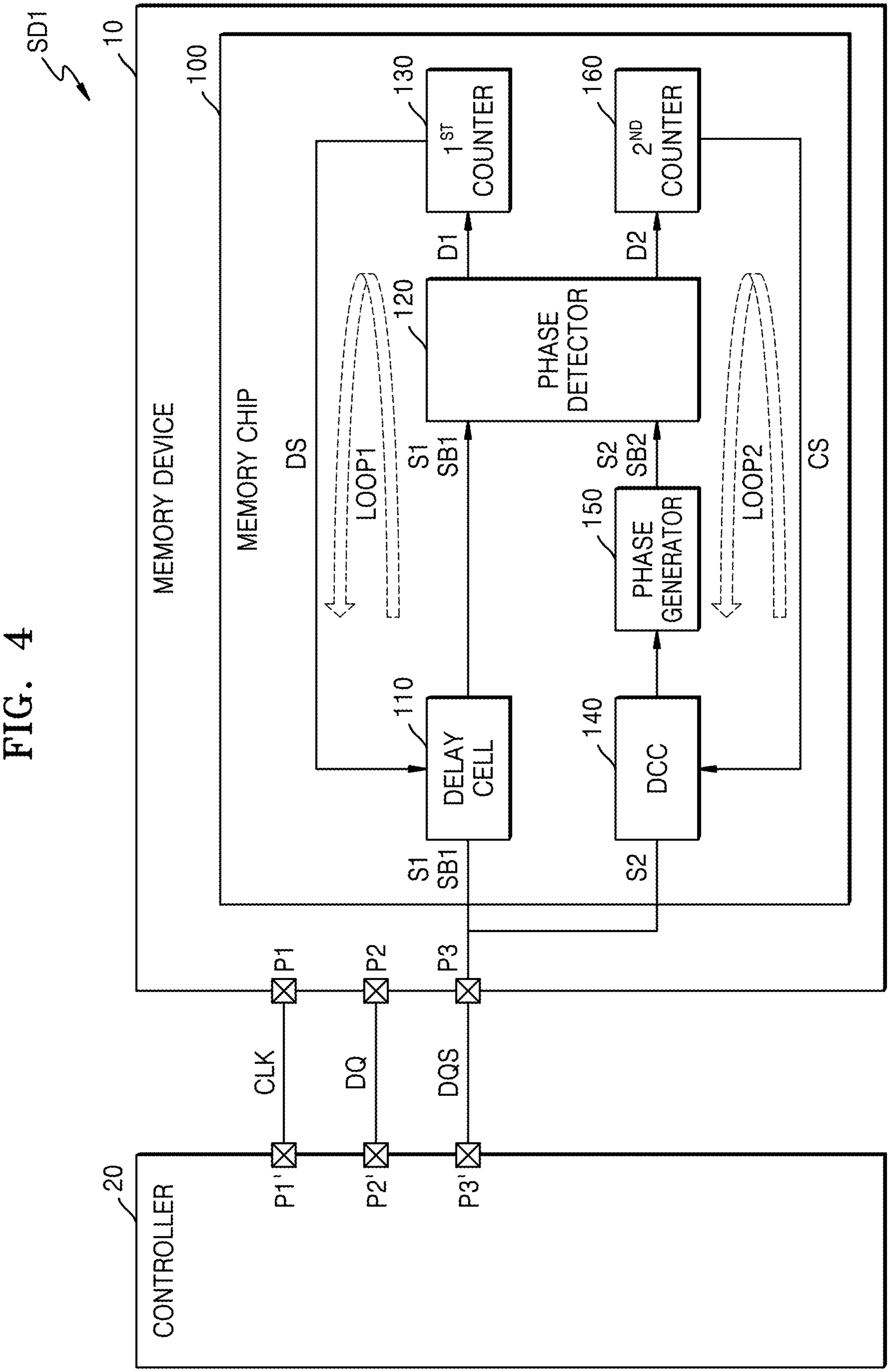
FIG. 4 is a block diagram of a storage device according to an embodiment.

FIG. 4 is a block diagram of an example of the storage device SD1 according to an embodiment. Referring to FIG. 4, the storage device SD1 may include the memory device 10 and the controller 20, and the memory device 10 may include the memory chip 100. According to an embodiment, the number of memory chips included in the memory device 10 may be variously selected. The memory device 10 may include a clock pin P1 and a plurality of input and output pins, that is, first and second pins P2 and P3. As will be understood by those skilled in the art, in some embodiments, these pins (e.g., P1-P3) may take the form of integrated circuit pads, etc. on a chip or substrate surface.

The memory device 10 may be electrically connected to the controller 20 through the clock pin P1 and the first and second pins P2 and P3. The controller 20 may include a clock pin P1' and first and second pins P2' and P3', and the clock pin P1' and the first and second pins P2' and P3' may be connected to the clock pin P1 and the first and second pins P2 and P3 of the memory device 10, respectively. The controller 20 may correspond to the memory controller. For example, the memory device 10 and the controller 20 may be realized to comply with a protocol, such as Toggle or ONFI.

The memory chip 100 may include a delay cell 110, a phase detector 120, a first counter 130, a DCC 140, a phase generator 150, and a second counter 160. According to an embodiment, the memory chip 100 may include a first loop circuit LC1 and a second loop circuit LC2. The first loop circuit LC1 may include the delay cell 110, the phase detector 120, and the first counter 130, and the second loop circuit LC2 may include the DCC 140, the phase generator 150, the phase detector 120, and the second counter 160.

As shown, the delay cell 110 and the DCC 140 may be connected in common to the second pin P3. The delay cell 110 may receive a first signal and a first reverse signal SB1 from the controller 20, and the DCC 140 may receive a second signal S2 from the controller 20. The phase detector 120 may detect a phase difference between the first signal S1 and the second signal S2 to generate a first comparison signal D1 and may provide the generated first comparison signal D1 to the first counter 130. The first counter 130 may generate a delay signal DS according to the first comparison signal D1 and may provide the delay signal DS to the delay cell 110. Thus, the delay cell 110 may perform a phase calibration operation of the first signal S1 according to the delay signal DS to form a first loop LOOP1. The first loop LOOP1 may perform a phase calibration operation on the first signal S1 and/or the second signal S2 during a training section. Here, the phase calibration operation may also be referred to as a phase align operation or phase alignment.

Detailed descriptions with respect to the phase calibration operation are to be given below with reference to FIGS. 6 to 8.

The phase generator 150 may generate a second reverse signal SB2 based on the second signal S2. The phase detector 120 may compare a duty cycle of the first reverse signal SB1 with a duty cycle of the second reverse signal SB2 to generate a second comparison signal D2 and may provide the generated second comparison signal D2 to the second counter 160. The second counter 160 may generate a control signal CS according to the second comparison signal D2 and may provide the control signal CS to the DCC 140. Thus, the DCC 140 may perform a duty cycle correction operation on the second signal S2 according to the control signal CS to form a second loop LOOP2. The second loop LOOP2 may perform a duty cycle correction operation on the first signal S1 and/or the second signal S2 during a training section. Detailed descriptions with respect to the duty cycle correction operation are to be given below with reference to FIGS. 6, 9, and 10.

Figure 5:
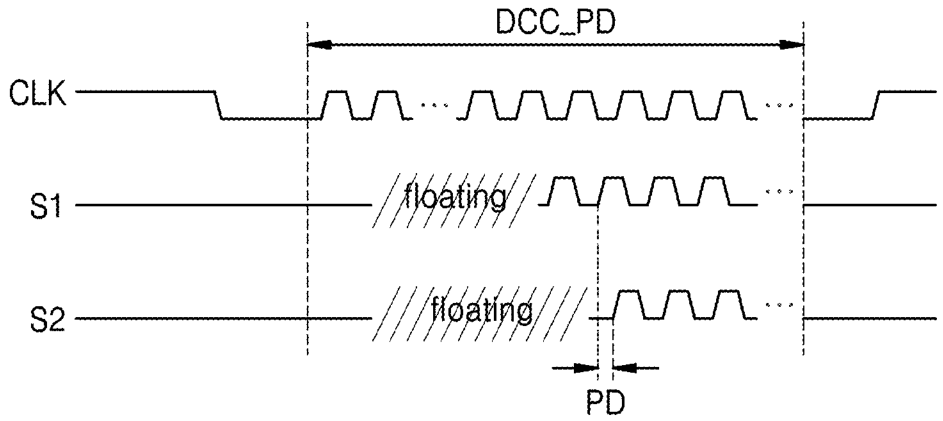
FIG. 5 is a timing diagram of signals according to a duty correction operation performed by the storage device of FIG. 4.

FIG. 5 is a timing diagram of signals according to a duty cycle correction operation performed by the storage device SD1 of FIG. 4. Referring to FIGS. 5 and 4 together, the memory device 10 may be an asynchronous system and may not have a frequency at which the memory device 10 always toggles, and thus, the DCC 140 may perform the duty cycle correction operation only in a section in which the clock signal CLK is applied. According to an embodiment, the memory device 10 may perform the duty cycle correction operation by using the read enable signal nRE as the clock signal CLK. When, during a read section in which a read operation on the memory device 10 is performed, the duty cycle correction operation is performed in a read-out section in which read data is output, a clock duty cycle may be changed for each clock cycle due to the duty cycle correction operation, and thus, valid data windows of the read data may be reduced.

Thus, according to an embodiment, the DCC 140 may perform the duty cycle correction operation in a DCC training section DCC_PD. Hereinafter, the dedicated section for the duty cycle correction operation may be referred to as a "DCC training section DCC_PD," and operations performed by the DCC 140 in the DCC training section DCC_PD may be referred to as "DCC training." According to an embodiment, the "DCC training section DCC_PD" may include a predetermined number of clock cycles. During the DCC training section DCC_PD, the clock signal CLK, for example, the read enable signal nRE, may toggle at a predetermined frequency, regardless of an operation of output buffers.

According to an embodiment, in the DCC training section DCC_PD, the memory chip 100 may provide the first signal S1 and the second signal S2 to the second pin P3. Here, a phase difference PD may occur between the first signal S1 and the second signal S2. In order to improve the reliability of the memory device 10, it is necessary to remove the phase difference PD.

Thus, the memory device 10 may include the phase detector 120. The phase detector 120 may detect the phase difference PD between the first signal S1 and the second signal S2 to generate the first comparison signal D1 and may provide the generated first comparison signal D1 to the first counter 130. The first counter 130 may generate the delay signal DS and provide the delay signal DS to the delay cell 110. The delay cell 110 may perform a phase calibration operation on the first signal S1 according to the delay signal DS. That is, the phase detector 120, the first counter 130, and the delay cell 110 may form a loop performing a phase calibration operation, that is, the first loop.

Also, the phase detector 120 may detect a phase difference PD between the first reverse signal SB1 and the second reverse signal SB2 to generate the second comparison signal D2 and may provide the generated second comparison signal D2 to the second counter 160. The second counter 160 may generate the control signal CS and provide the generated control signal CS to the DCC 140. The DCC 140 may perform a duty cycle correction operation on the second signal S2 according to the control signal CS. That is, the phase detector 120, the second counter 160, and the DCC 140 may form a loop performing the duty cycle correction operation, that is, the second loop.

The memory device 10 may perform the phase calibration operation and the duty cycle correction operation, and thus, the performance and the reliability of the memory device 10 may be improved. Also, the memory device 10 may form the phase calibration operation loop and the duty cycle correction operation loop in the training section, and thus, may reduce degradation of the duty cycle.

In this specification, the first signal S1 may be referred to as a "reference signal," and the second signal S2 may be referred to as a "target signal." The phase calibration operation may be performed based on a phase of the first signal S1, that is, the reference signal. The configurations of the memory chip 100 and the interface chip (105 of FIG. 2) may be substantially the same.

Figure 6:
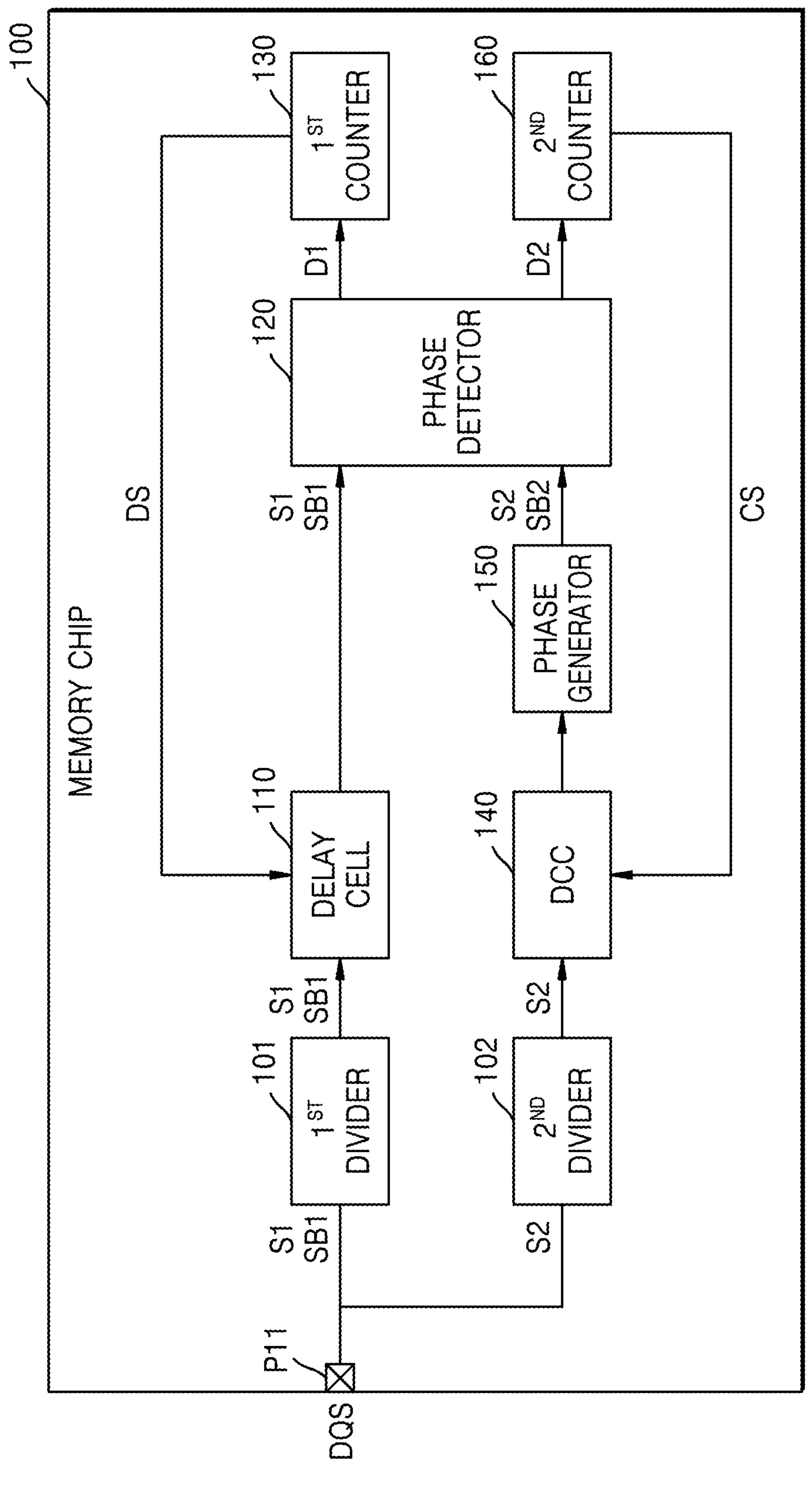
FIG. 6 is a block diagram of a memory chip according to an embodiment.

FIG. 6 is a block diagram of the memory chip 100 according to an embodiment. Referring to FIG. 6, the memory chip 100 may correspond to the memory chip 100 of FIG. 4. The memory chip 100 may include a first divider 101, a second divider 102, the delay cell 110, the phase detector 120, the first counter 130, the DCC 140, the phase generator 150, the second counter 160, and a first pad P11. The first pad P11 may correspond to the second pin P3 of FIG. 4.

The memory chip 100 may output a first signal S1 and a second signal S2 to have the same phase as each other at the first pad P11. However, a delay generated in a path in which the first signal S1 is transmitted and a delay generated in a path in which the second signal S2 is transmitted may be different from each other. The difference may be caused not only by a mismatch in the transmission paths, but also depending on the memory chip 100 outputting the first signal S1 and the second signal S2.

The first divider 101 may receive the first signal S1 and a first reverse signal SB1 through the first pad P11. The first divider 101 may provide the received first signal S1 to the phase detector 120. For example, a phase of the first signal S1 may be 0 degrees, and a phase of the first reverse signal SB1 may be 180 degrees. The phase of the first signal S1 may be 90 degrees, and the phase of the first reverse signal SB1 may be 270 degrees. That is, a phase difference between the first signal S1 and the first reverse signal SB1 may be 180 degrees.

The second divider 102 may receive the second signal S2 through the first pad P11. The second divider 102 may provide the received second signal S2 to the phase generator 150. The phase generator 150 may generate a second reverse signal SB2 based on the received second signal S2. For example, a phase of the second signal S2 may be 0 degrees, and a phase of the second reverse signal SB2 may be 180 degrees. The phase of the second signal S2 may be 90 degrees, and the phase of the second reverse signal SB2 may be 270 degrees. That is, a phase difference between the second signal S2 and the second reverse signal SB2 may be 180 degrees. According to an embodiment, the first signal S1 and the second signal S2 may be toggle signals toggling at a predetermined frequency and may correspond to data strobe signals.

The phase detector 120 may receive the first signal S1 and the second signal S2 and may detect a phase difference between the first signal S1 and the second signal S2 to generate a first comparison signal D1. The phase detector 120 may provide the generated first comparison signal D1 to the first counter 130.

The first counter 130 may generate a delay signal DS according to the first comparison signal D1 and may provide the delay signal DS to the delay cell 110. Then, the delay cell 110 may perform a phase calibration operation on the first signal S1 according to the delay signal DS to form a first loop. The first loop may perform a phase calibration operation on the first signal S1 and/or the second signal S2 during a DCC training section.

The phase detector 120 may receive the first reverse signal SB1 and the second reverse signal SB2. The phase detector 120 may compare a duty cycle of the first reverse signal SB1 and a duty cycle of the second reverse signal SB2 to generate a second comparison signal D2. The phase detector 120 may provide the generated second comparison signal D2 to the second counter 160.

Then, the second counter 160 may generate a control signal CS according to the second comparison signal D2 and may provide the control signal CS to the DCC 140. The DCC 140 may perform a duty cycle correction operation on the second signal S2 according to the control signal CS to form a second loop. The second loop may perform a duty cycle correction operation on the first signal S1 and/or the second signal S2 during the DCC training section.

Also, the memory chip 100 may include a timing controller configured to generate a plurality of timing control signals synchronized with the read enable signal. For example, the timing controller 20 may generate an enable signal for enabling the first counter 130 and the second counter 160, and the first counter 130 and the second counter 160 may be enabled in response to the enable signal. Also, for example, the timing controller may generate an activation signal for activating counting operations of the first counter 130 and the second counter 160, and the first counter 130 and/or the second counter 160 may generate the delay signal DS and/or the control signal CS in response to the activation signal.

According to the present embodiment, the memory chip may sequentially perform the phase calibration operation and the duty cycle correction operation. For example, the first loop may perform the phase calibration operation, and the second loop may perform the duty cycle correction operation. According to an embodiment, the first loop may detect the phase difference between the first signal S1 and the second signal S2 to generate the first comparison signal D1 and may generate the delay signal DS according to the first comparison signal D1 to adjust a delay time of the first signal S, and thus, may align the phases of the first signal S1 and the second signal S2. According to an embodiment, the second loop may detect the phase difference between the first reverse signal SB1 and the second reverse signal SB2 to generate the second comparison signal D2 and may generate the control signal CS according to the second comparison signal D2, and thus, may perform duty cycle correction for adjusting the duty cycle of the second signal S2.

Figure 7:
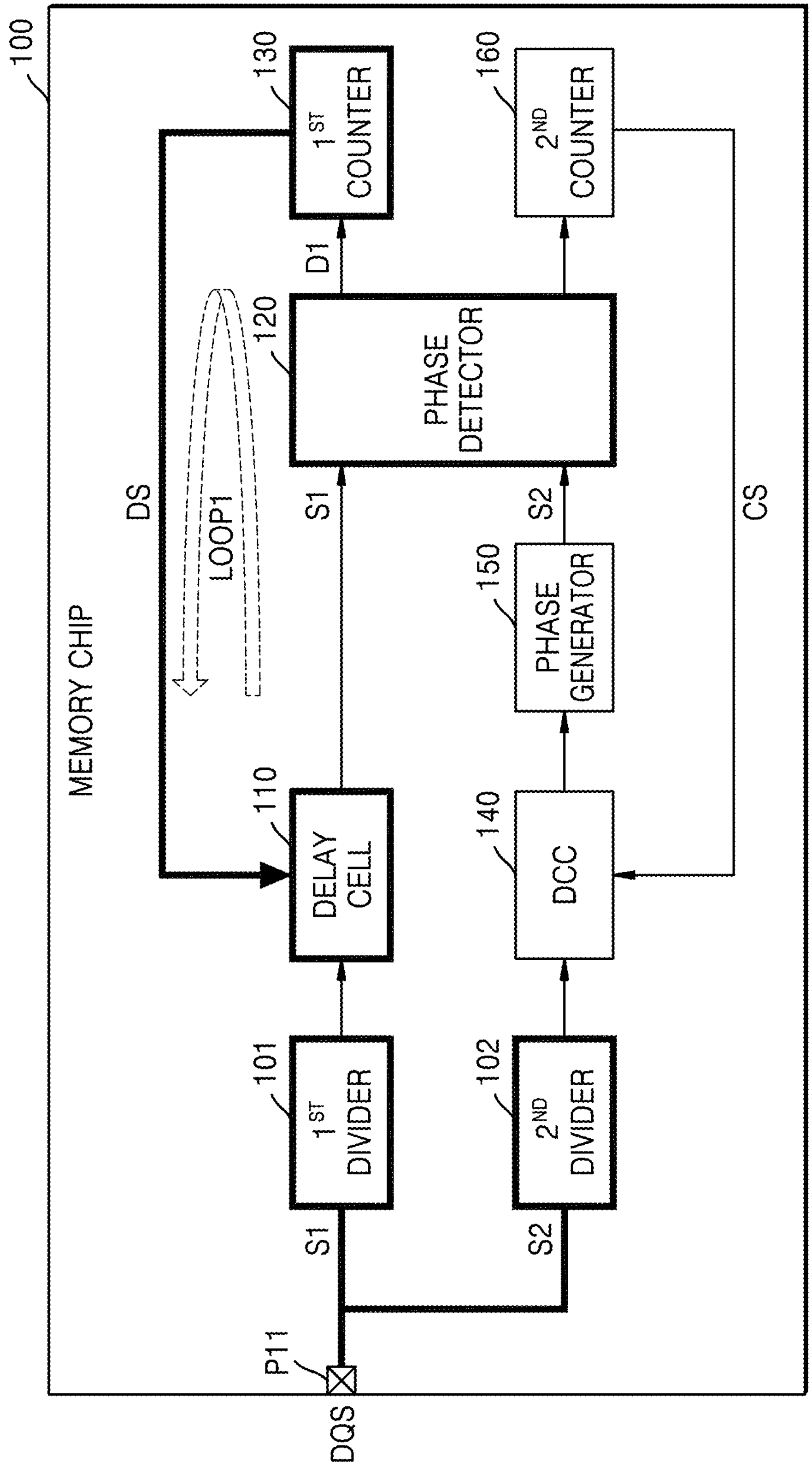
FIG. 7 is a block diagram of a phase calibration operation of a memory chip, according to an embodiment.

FIG. 7 is a block diagram of a phase calibration operation of the memory chip 100, according to an embodiment. The aspects that are the same as FIG. 6 are not repeatedly described. Referring to FIG. 7, the first divider 101 may receive a first signal S1 and the second divider 102 may receive a second signal S2 through the first pad P11. The phase detector 120 may receive the first signal S1 and the second signal S2. The phase detector 120 may detect a phase difference between the first signal S1 and the second signal S2 to generate a first comparison signal D1. The first counter 130 may generate a delay signal DS according to the first comparison signal D1 generated by the phase detector 120 and may provide the generated delay signal DS to the delay cell 110. The delay cell 110 may perform a phase calibration operation on the first signal S1 according to the delay signal DS to form a first loop. The first loop may align phases of the first signal S1 and the second signal S2 during a DCC training section.

Figure 8:
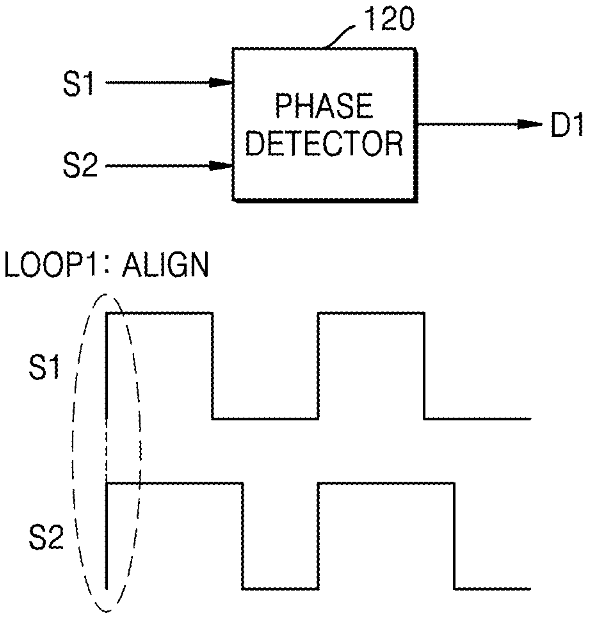
FIG. 8 is a timing diagram of an operation of the phase detector of FIG. 7, according to an embodiment.

FIG. 8 is a timing diagram of an operation of the phase detector 120 of FIG. 7, according to an embodiment. Referring to FIGS. 7 and 8, a phase difference may occur between the first signal S1 and the second signal S2, and thus, a time difference may occur between a rising edge of the first signal S1 and a rising edge of the second signal S2. The reason that the phase difference occurs between the first signal S1 and the second signal S2 may be because a delay generated in a path in which the first signal S1 is transmitted and a delay generated in a path in which the second signal S2 is transmitted may be different from each other.

As described above, in order to remove the phase difference occurring between the first signal S1 and the second signal S2, the phase detector 120 may generate the first comparison signal D1 by detecting the phase difference between the first signal S1 and the second signal S2. For example, the phase detector 120 may convert the phase difference between the first signal S1 and the second signal S2 into a duty of the first comparison signal D1 and may convert the first comparison signal D1 into a duty of the delay signal DS. The first comparison signal D1 or the delay signal DS may have a duty ratio or a duty cycle based on the phase difference between the first signal S1 and the second signal S2.

Figure 9:
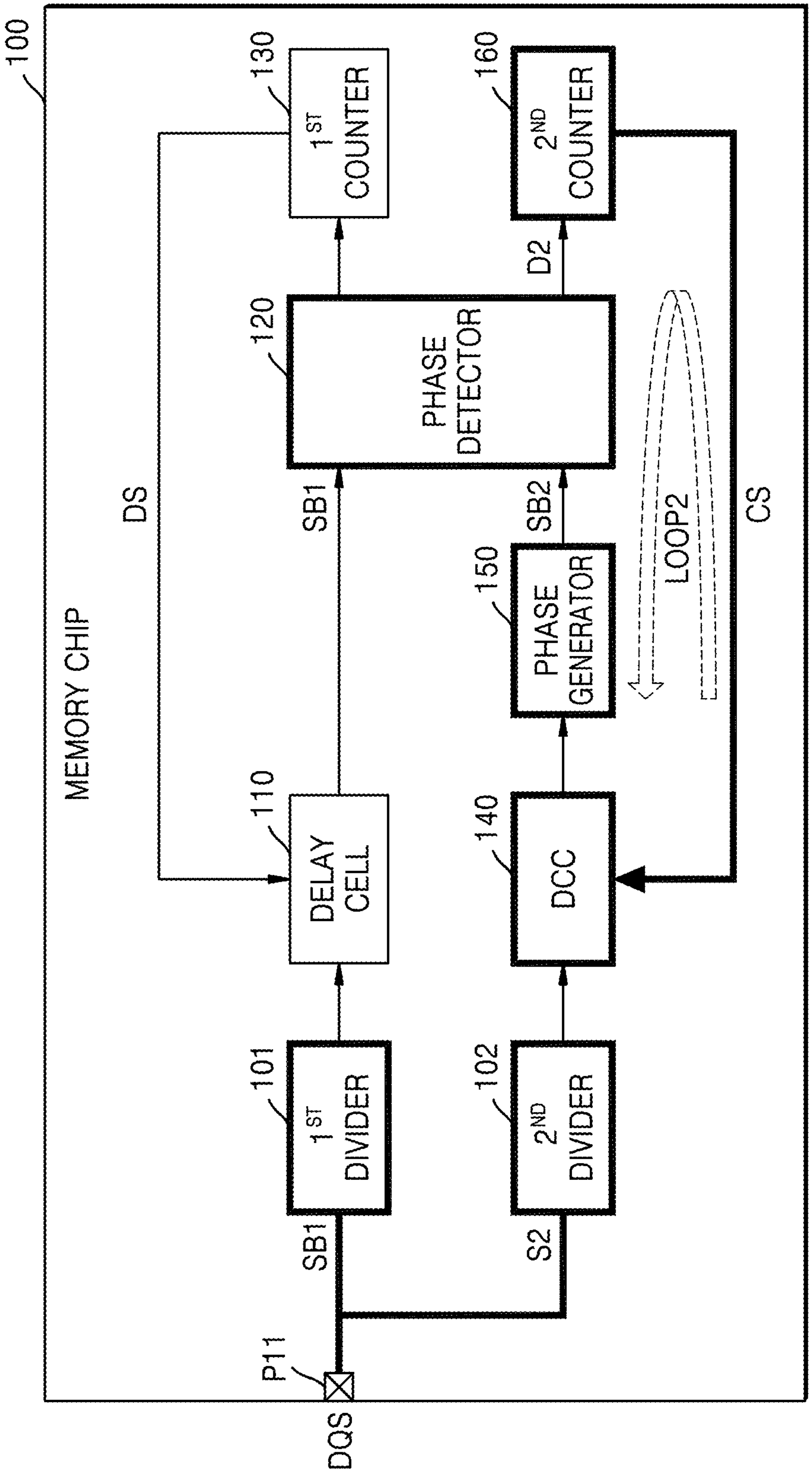
FIG. 9 is a block diagram of a duty correction operation of a memory chip, according to an embodiment.

FIG. 9 is a block diagram of a duty cycle correction operation of the memory chip 100, according to an embodiment. The aspects that are the same as FIG. 6 are not repeatedly described. Referring to FIG. 9, the first divider 101 may receive a first reverse signal SB1 and the second divider 102 may receive a second signal S2 through the first pad P11. The phase generator 150 may generate a second reverse signal SB2 based on the second signal S2. The phase detector 120 may receive the first reverse signal SB1 and the second reverse signal SB2. The phase detector 120 may detect a phase difference between the first reverse signal SB1 and the second reverse signal SB2 or compare a duty cycle of the first reverse signal SB1 with a duty cycle of the second reverse signal SB2 to generate a second comparison signal D2. The second counter 160 may generate a control signal CS according to the second comparison signal D2 generated by the phase detector 120 and may provide the control signal CS to the DCC 140. The DCC 140 may perform a duty cycle correction operation on the second signal S2 according to the control signal CS to form a second loop. The second loop may correct the duty cycle of the second signal S2 during a DCC training section.

Figure 10:
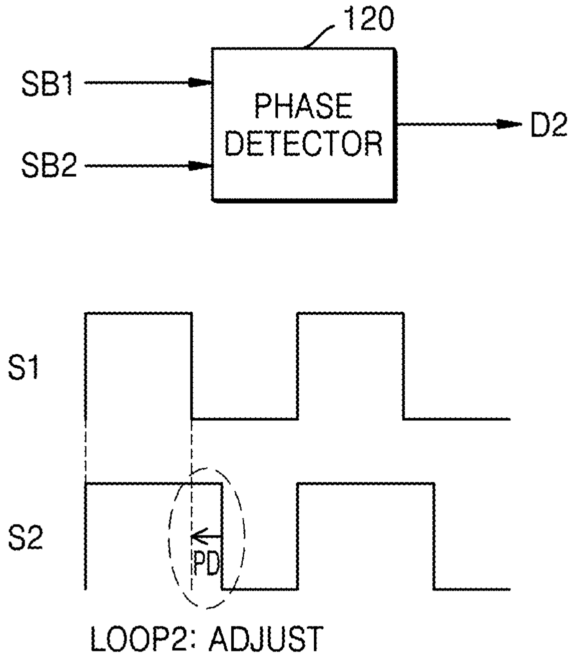
FIG. 10 is a timing diagram of an operation of the phase detector of FIG. 9, according to an embodiment.

FIG. 10 is a timing diagram of an operation of the phase detector 120 of FIG. 9, according to an embodiment. Referring to FIGS. 9 and 10, a phase difference may occur between the first reverse signal SB1 and the second reverse signal SB2, and thus, a time difference may occur between a rising edge of the first reverse signal SB1 and a rising edge of the second reverse signal SB2.

As described above, in order to remove the phase difference occurring between the first reverse signal SB1 and the second reverse signal SB2, the phase detector 120 may generate the second comparison signal D2 by detecting the phase difference between the first reverse signal SB1 and the second reverse signal SB2. For example, the phase detector 120 may convert the phase difference between the first reverse signal SB1 and the second reverse signal SB2 into a duty of the second comparison signal D2 and may convert the second comparison signal D2 into a duty of the control signal CS. The second comparison signal D2 or the control signal CS may have a duty ratio or a duty cycle based on the phase difference between the first reverse signal SB1 and the second reverse signal SB2.

Figure 11:
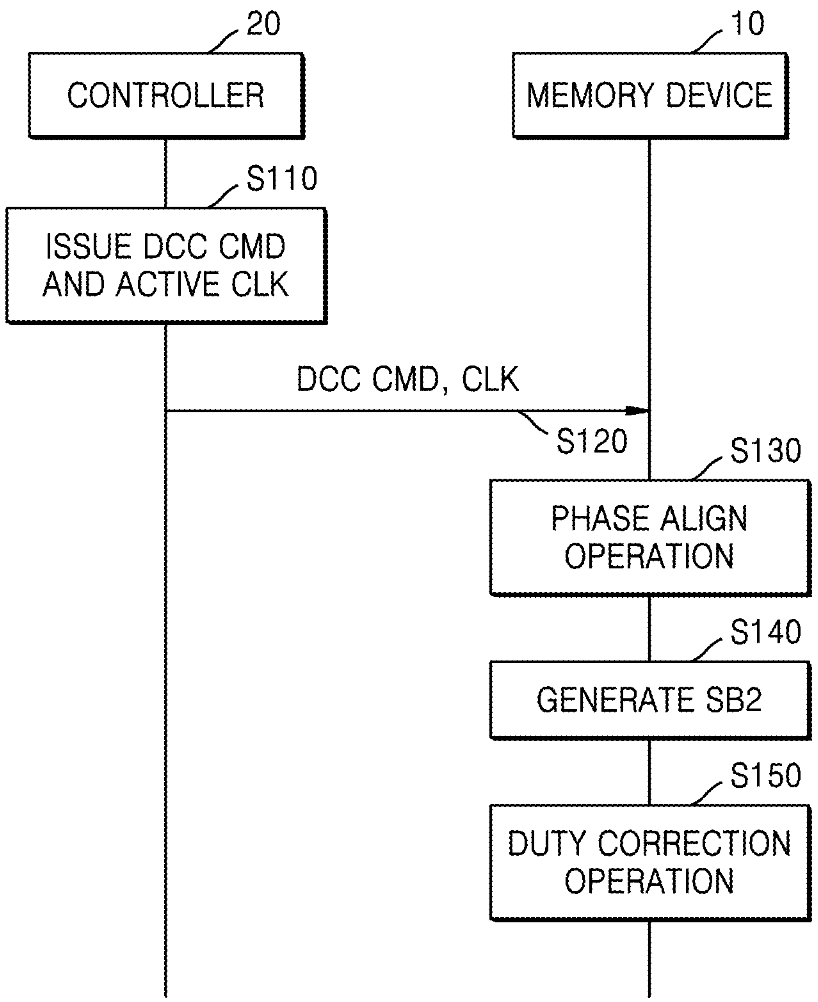
FIG. 11 is a flowchart of operations of a controller and a memory device, according to an embodiment.

FIG. 11 is a flowchart of operations of the controller 20 and the memory device 10, according to an embodiment. Referring to FIG. 11, in operation S110, the controller 20 may issue a DCC command DCC CMD instructing to start DCC training and may activate a clock signal CLK. For example, the DCC command DCC CMD may be realized as a set feature command. For example, the clock signal CLK may be a read enable signal nRE. In operation S120, the controller 20 may transmit the DCC command DCC CMD and the activated clock signal CLK to the memory device 10. For example, the DCC command DCC CMD may be transmitted from the controller 20 to the memory device 10 through the second pins P3 and P3', and the clock signal CLK may be transmitted from the controller 20 to the memory device 10 through the clock pins P1 and P1'.

In operation S130, the memory device 10 may align phases of a first signal S1 and a second signal S2. In detail, with reference to FIGS. 6 and 7, the phase detector 120 may receive the first signal S1 and the second signal S2 and may receive a read enable signal nRE. The phase detector 120 may detect a phase difference between the first signal S1 and the second signal S2 to generate a first comparison signal D1 and may provide the generated first comparison signal D1 to the first counter 130. The first counter 130 may generate a delay signal DS according to the first comparison signal D1 and may provide the delay signal DS to the delay cell 110. The delay cell 110 may perform a phase calibration operation on the first signal S1 according to the delay signal DS to form a first loop. The first loop may perform a phase calibration operation on the first signal S1 and/or the second signal S2 during a DCC training section.

In operation S140, the memory device 10 may generate a second reverse signal SB2. For example, with reference to FIG. 6, the phase generator 150 may generate the second reverse signal SB2 based on the received second signal S2. Then, in operation S150, the memory device 10 may perform a duty cycle correction operation on the first signal S1 and the second signal S2. In detail, with reference to FIGS. 6 and 9, the phase detector 120 may receive the first reverse signal SB1 and the second reverse signal SB2 and may receive the read enable signal nRE. The phase detector 120 may compare a duty cycle of the first reverse signal SB1 with a duty cycle of the second reverse signal SB2 to generate a second comparison signal D2 and may provide the generated second comparison signal D2 to the second counter 160. The second counter 160 may generate a control signal CS according to the second comparison signal D2 and may provide the control signal CS to the DCC 140. The DCC 140 may perform a duty cycle correction operation on the second signal S2 according to the control signal CS to form a second loop. The second loop may perform a duty cycle correction operation on the first signal S1 and/or the second signal S2 during the DCC training section.

The memory device 10 according to the present embodiment may perform the phase calibration operation and the duty cycle correction operation, and thus, the performance and the reliability of the memory device 10 may be improved. Also, the memory device 10 may form the phase calibration operation loop and the duty cycle correction operation loop in the training section, and thus, may reduce degradation of the duty cycle.

Figure 12:
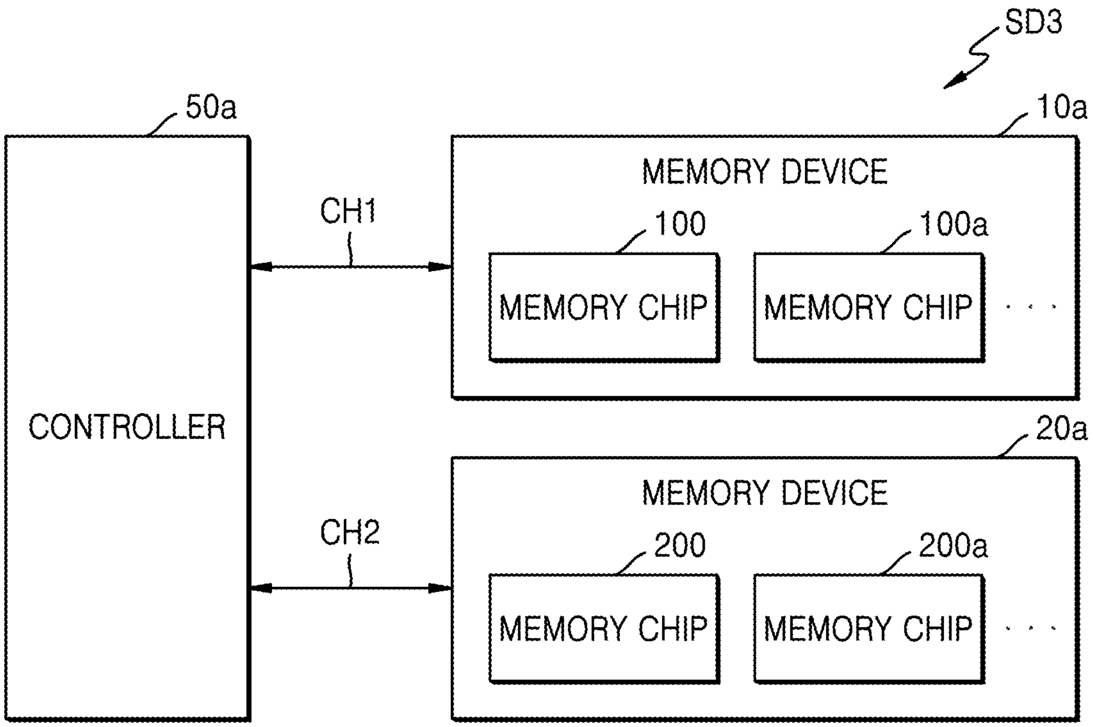
FIG. 12 is a schematic block diagram of a storage device according to an embodiment.

FIG. 12 is a schematic block diagram of a storage device SD3 according to an embodiment. Referring to FIG. 12, the storage device SD3 may include first and second memory devices 10*a* and 20*b* and a controller 50*a*, wherein the first memory device 10*a* may be connected to the controller 50*a* through a first channel CH1, and the second memory device 20*b* may be connected to the controller 50*a* through a second channel CH2. The first memory device 10*a* may include a plurality of memory chips including at least first and second memory chips 100 and 100*a*. Thus, the plurality of memory chips including the first and second memory chips 100 and 100*a* may transmit and receive data to and from the controller 50*a* through the first channel CH1. The second memory device 20*b* may include a plurality of memory chips including at least first and second memory chips 200 and 200*a*. Thus, the plurality of memory chips including the first and second memory chips 200 and 200*a* may transmit and receive data to and from the controller 50*a* through the second channel CH2.

The plurality of memory chips included in the first memory device 10*a* may perform a phase calibration operation based on a delay signal generated in the first memory chip 100, which is one of the plurality of memory chips, as illustrated in FIGS. 1 to 11, and thus, phases of signals respectively generated in the plurality of memory chips of the first memory device 10*a* may be aligned. Likewise, the plurality of memory chips included in the second memory device 20*b* may perform a phase calibration operation based on a delay signal generated in the first memory chip 200, which is one of the plurality of memory chips, as illustrated in FIGS. 1 to 11, and thus, phases of signals respectively generated in the plurality of memory chips of the second memory device 20*b* may be aligned.

Also, the controller 50*a* may perform a phase calibration operation based on a phase difference between a first signal received from the first memory chip 100, which is one of the plurality of memory chips connected to the first channel CH1, and a delay signal received from the first memory chip 200, which is one of the plurality of memory chips connected to the second channel CH2. In detail, the controller 50*a* may calibrate a phase of a second signal based on a phase of the first signal.

As described above, according to the present embodiment, the phase calibration operation between the memory chips connected to the same channel may be performed. Also, according to the present embodiment, the phase calibration operation between the memory chips connected to the different channels from each other may also be performed.

Figure 13:
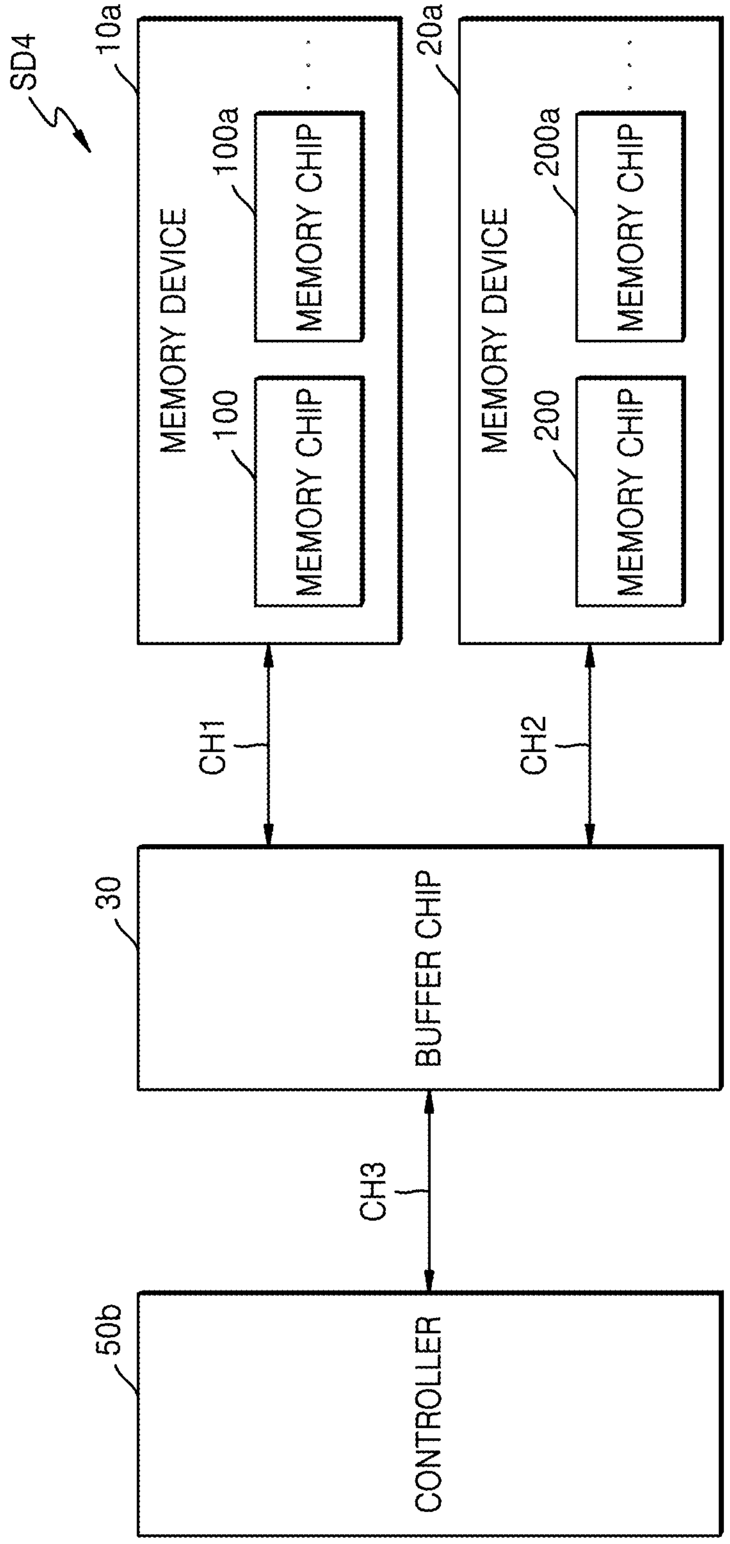
FIG. 13 is a schematic block diagram of a storage device according to an embodiment.

FIG. 13 is a schematic block diagram of a storage device SD4 according to an embodiment. Referring to FIG. 13, the storage device SD4 may include the first and second memory devices 10*a* and 20*b*, a buffer chip 30, and a controller 50*b*. The storage device SD4 according to the present embodiment may further include the buffer chip 30, compared with the storage device SD3 of FIG. 12. The buffer chip 30 may be connected between the controller 50*b* and the first and second memory devices 10*a* and 20*b* and may also be referred to as a frequency boosting interface (FBI) circuit. According to an embodiment, the first and second memory devices 10*a* and 20*b* and the buffer chip 30 may be realized as a single package and may be referred to as a nonvolatile memory device.

The first memory device 10*a* may be connected to the buffer chip 30 through a first channel CH1, the second memory device 20*b* may be connected to the buffer chip 30 through a second channel CH2, and the buffer chip 30 may be connected to the controller 50*b* through a third channel CH3. The first memory device 10*a* may include the plurality of memory chips including at least the first and second memory chips 100 and 100*a*, and thus, the plurality of memory chips including the first and second memory chips 100 and 100*a* may transmit and receive data to and from the buffer chip 30 through the first channel CH1. The second memory device 20*b* may include the plurality of memory chips including the first and second memory chips 200 and 200*a*, and thus, the plurality of memory chips including the first and second memory chips 200 and 200*a* may transmit and receive data to and from the buffer chip 30 through the second channel CH2.

The plurality of memory chips included in the first memory device 10*a* may perform a phase calibration operation based on a delay signal generated in the first memory chip 100, which is one of the plurality of memory chips, as illustrated in FIGS. 1 to 12, and thus, phases of signals respectively generated in the plurality of memory chips of the first memory device 10*a* may be aligned. Also, the plurality of memory chips included in the first memory device 10*a* may perform a duty cycle correction operation based on a control signal generated in the first memory chip 100, which is one of the plurality of memory chips, as illustrated in FIGS. 1 to 12, and thus, duty cycles or duty ratios of the signals respectively generated in the plurality of memory chips of the first memory device 10*a* may be corrected.

Likewise, the plurality of memory chips included in the second memory device 20*b* may perform a phase calibration operation based on a first signal generated in the first memory chip 200, which is one of the plurality of memory chips, as illustrated in FIGS. 1 to 12, and thus, phases of signals respectively generated in the plurality of memory chips of the second memory device 20*b* may be aligned. The plurality of memory chips included in the second memory device 20*b* may perform a duty cycle correction operation based on a control signal generated in the first memory chip 200, which is one of the plurality of memory chips, as illustrated in FIGS. 1 to 12, so that the duty cycles or duty ratios of the signals respectively generated in the plurality of memory chips of the second memory device 20*b* may be corrected.

Also, the buffer chip 30 may perform a phase calibration operation on first and second signals, based on a phase difference between the first signal received from the first memory chip 100, which is one of the plurality of memory chips connected to the first channel CH1, and a delay signal received from the first memory chip 200, which is one of the plurality of memory chips connected to the second channel CH2. In detail, the buffer chip 30 may calibrate a phase of the second signal based on a phase of the first signal. The buffer chip 30 may perform a duty cycle correction operation on the first and second signals, based on a phase difference between the control signals received from the first memory chip 200, which is one of the plurality of memory chips.

As described above, according to the present embodiment, the phase calibration operation may be performed between the memory chips connected to the same channel. Also, according to the present embodiment, the phase calibration operation may also be performed between the memory chips connected to the different channels from each other.

Figure 14:
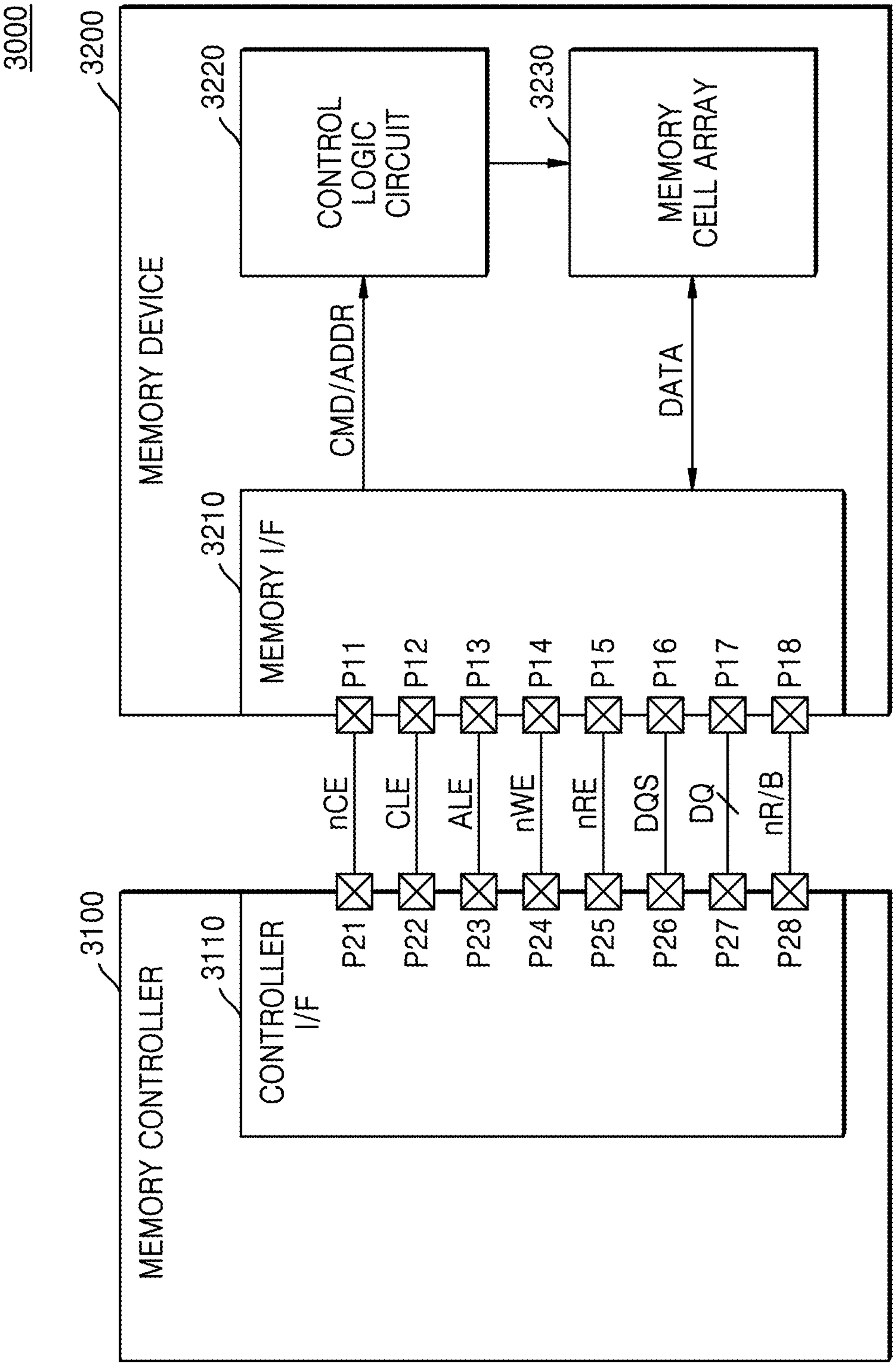
FIG. 14 is a block diagram of a memory system according to an embodiment.

FIG. 14 is a block diagram of a memory system 3000 according to an embodiment. Referring to FIG. 14, the memory system 3000 may include a memory device 3200 and a memory controller 3100. The memory device 3200 may correspond to one of nonvolatile memory devices communicating with the memory controller 3100 based on one of a plurality of channels. For example, the memory device 3200 may correspond to the memory device 10 of FIG. 3, and the memory controller 3100 may correspond to the controller 20 of FIG. 3.

The memory device 3200 may include first to eighth pins P11 to P18, a memory interface circuit 3210, a control logic circuit 3220, and a memory cell array 3230. The memory interface circuit 3210 may receive a chip enable signal nCE from the memory controller 3100 through the first pin P11. The memory interface circuit 3210 may transmit and receive signals to and from the memory controller 3100 through the second to eighth pins P12 to P18 according to the chip enable signal nCE. For example, when the chip enable signal nCE is in an enable state (for example, a low level), the memory interface circuit 3310 may transmit and receive signals to and from the memory controller 3100 through the second to eighth pins P12 to P18.

The memory interface circuit 3210 may receive a command latch enable signal CLE, an address latch enable signal ALE, and a write enable signal nWE from the memory controller 3100 through the second to fourth pins P12 to P14. The memory interface circuit 3210 may receive a data signal DQ from the memory controller 3100 or transmit the data signal DQ to the memory controller 3100 through the seventh pin P17. A command CMD, an address ADDR, and data may be transmitted through the data signal DQ. For example, the data signal DQ may be transmitted through a plurality of data signal lines. In this case, the seventh pin P17 may include a plurality of pins corresponding to a plurality of data signals.

The memory interface circuit 3210 may obtain the command CMD from the data signal DQ received in an enable section (for example, a high level state) of the command latch enable signal CLE based on toggle timings of the write enable signal nWE. The memory interface circuit 3210 may obtain the address ADDR from the data signal DQ received in an enable section (for example, a high level state) of the address latch enable signal ALE based on toggle timings of the write enable signal nWE.

According to an embodiment, the write enable signal nWE may maintain a static state (for example, a high level or a low level) and may toggle between the high level and the low level. For example, the write enable signal nWE may toggle in a section in which the command CMD or the address ADDR is transmitted. Accordingly, the memory interface circuit 3210 may obtain the command CMD or the address ADDR based on the toggle timings of the write enable signal nWE.

The memory interface circuit 3210 may receive a read enable signal nRE from the memory controller 3100 through the fifth pin P15. The memory interface circuit 3210 may receive a data strobe signal DQS from the memory controller 3100 or transmit the data strobe signal DQs to the memory controller 3100 through the sixth pin P16.

In a data output operation of the memory device 3200, the memory interface circuit 3210 may receive the read enable signal nRE toggling through the fifth pin P15 before outputting the data. The memory interface circuit 3210 may generate the data strobe signal DQS toggling based on the toggling of the read enable signal nRE. For example, the memory interface circuit 3210 may generate the data strobe signal DQS starting to toggle after a predetermined delay (for example, tDQSRE) based on a toggling start time of the read enable signal nRE. The memory interface circuit 3210 may transmit the data signal DQ including the data based on a toggling timing of the data strobe signal DQS. Accordingly, the data may be aligned with the toggling timing of the data strobe signal DQS and may be transmitted to the memory controller 3100.

In a data input operation of the memory device 3200, when the data signal DQ including the data is received from the memory controller 3100, the memory interface circuit 3210 may receive the data strobe signal DQS toggling together with the data from the memory controller 3100. The memory interface circuit 3210 may obtain the data from the data signal DQ based on the toggling timing of the data strobe signal DQS. For example, the memory interface circuit 3210 may obtain the data by sampling the data signal DQ at a rising edge and a falling edge of the data strobe signal DQS.

The memory interface circuit 3210 may transmit a read/busy output signal nR/B to the memory controller 3100 through the eighth pin P18. The memory interface circuit 3210 may transmit state information of the memory device 3200 to the memory controller 3100 through the ready/busy output signal nR/B. When the memory device 3200 is in a busy state (that is, when internal operations of the memory device 3200 are being performed), the memory interface circuit 3210 may transmit the ready/busy output signal nR/B indicating the busy state to the memory controller 3100. When the memory device 3200 is in a ready state (that is, when the internal operations of the memory device 3200 are not being performed or have been completed), the memory interface circuit 3210 may transmit a ready/busy output signal nR/B indicating the ready state to the memory controller 3100. For example, while the memory device 3200 is reading the data from the memory cell array 3230 in response to a page read command, the memory interface circuit 3210 may transmit the ready/busy output signal nR/B indicating the busy state (for example, the low level) to the memory controller 3100. For example, while the memory device 3200 is programming the data to the memory cell array 3230 in response to a program command, the memory interface circuit 3210 may transmit the ready/busy output signal nR/B indicating the busy state to the memory controller 3100.

The control logic circuit 3220 may generally control various operations of the memory device 3200. The control logic circuit 3220 may receive a command/address CMD/ADDR obtained from the memory interface circuit 3210. The control logic circuit 3220 may generate control signals for controlling other elements of the memory device 3200 according to the received command/address CMD/ADDR. For example, the control logic circuit 3220 may generate various control signals for programming the data DATA in the memory cell array 3230 or read the data DATA from the memory cell array 3230.

The memory cell array 3230 may store the data DATA obtained from the memory interface circuit 3210 according to control by the control logic circuit 3220. The memory cell array 3230 may output the stored data DATA to the memory interface circuit 3210 according to control by the control logic circuit 3220. The memory cell array 3230 may include a plurality of memory cells. For example, the plurality of memory cells may be flash memory cells. However, the inventive concept is not limited thereto, and the memory cells may include resistive random-access memory (RRAM) cells, ferroelectric random-access memory (FRAM) cells, PRAM cells, thyristor random-access memory (TRAM) cells, and MRAM cells. Hereinafter, embodiments are described based on an embodiment in which the memory cells are NAND flash memory cells.

The memory controller 3100 may include first to eighth pins P21 to P28 and a controller interface circuit 3110. The first to eighth pins P21 to P28 may correspond to the first to eighth pins P11 to P18 of the memory device 3200. The controller interface circuit 3110 may transmit a chip enable signal nCE to the memory device 3200 through the first pin P21. The controller interface circuit 3110 may transmit and receive signals to and from the memory device 3200 selected through the chip enable signal nCE, through the second to eighth pins P22 to P28.

The controller interface circuit 3110 may transmit a command latch enable signal CLE, an address latch enable signal ALE, and a write enable signal nWE to the memory device 3200 through the second to fourth pins P22 to P24. The controller interface circuit 3110 may transmit a data signal DQ to the memory device 3200 or receive the data signal DQ from the memory device 3200 through the seventh pin P27. The controller interface circuit 3110 may transmit the data signal DQ including a command CMD or an address ADDR together with the write enable signal nWE toggling to the memory device 3200. As the controller interface circuit 3110 transmits the command latch enable signal CLE having an enable state, the controller interface circuit 3110 may transmit the data signal DQ including the command CMD to the memory device 3200, and as the controller interface circuit 3110 transmits the address latch enable signal ALE having an enable state, the controller interface circuit 3110 may transmit the data signal DQ including the address ADDR to the memory device 3200.

The controller interface circuit 3110 may transmit a read enable signal nRE to the memory device 3200 through the fifth pin P25. The controller interface circuit 3110 may receive a data strobe signal DQS from the memory device 3200 or transmit the data strobe signal DQs to the memory device 3200 through the sixth pin P26. In a data output operation of the memory device 3200, the controller interface circuit 3110 may write a toggling read enable signal nRE and may transmit the read enable signal nRE to the memory device 3200. For example, the controller interface circuit 3110 may generate the read enable signal nRE changing from a static state (for example, a high level or a low level) to a toggling state before the data DATA is output. Accordingly, the data strobe signal DQS toggling based on the read enable signal nRE may be generated in the memory device 3200. The controller interface circuit 3110 may receive the data signal DQ including the data DATA together with the toggling data strobe signal DQS from the memory device 3200. The controller interface circuit 3110 may obtain the data DATA from the data signal DQ based on a toggling timing of the data strobe signal DQS.

In a data input operation of the memory device 3200, the controller interface circuit 3110 may generate the data strobe signal DQS toggling. For example, the controller interface circuit 3110 may generate the data strobe signal DQS changing from a static state (for example, a high level or a low level) to a toggling state before the data DATA is transmitted. The controller interface circuit 3110 may transmit, to the memory device 3200, the data signal DQ including the data DATA based on the toggling timing of the data strobe signal DQS. The controller interface circuit 3110 may receive a ready/busy output signal nR/B from the memory device 3200 through the eighth pin P28. The controller interface circuit 3110 may determine state information of the memory device 3200 based on the ready/busy output signal nR/B.

Figure 15:
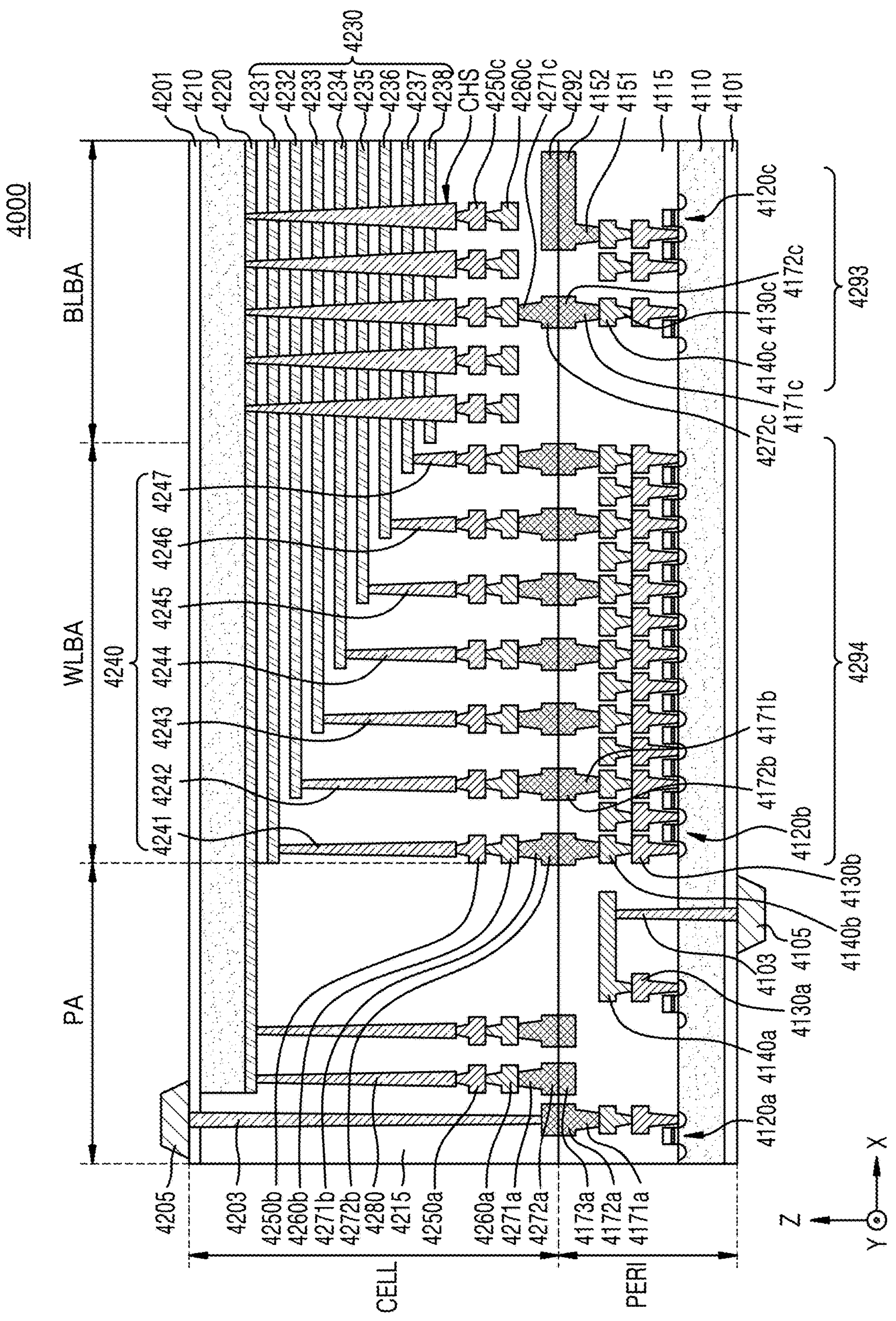
FIG. 15 is a diagram for describing a bonding vertical NAND (B-VNAND) structure which may be implemented in a memory device according to an embodiment.

FIG. 15 is a diagram for describing a bonding vertical NAND (B-VNAND) structure which may be implemented in a memory device 4000 according to an embodiment. When a nonvolatile memory included in the memory device is realized as a B-VNAND-type flash memory, the nonvolatile memory may have the structure illustrated in FIG. 15.

Referring to FIG. 15, the memory device 4000 may have a chip-to-chip (C2C) structure. The C2C structure may indicate a structure in which an upper chip including a cell region CELL is manufactured on a first wafer and a lower chip including a peripheral circuit region PERI is manufactured on a second wafer, which is different from the first wafer, and then, the upper chip and the lower chip are connected to each other by a bonding process. For example, the bonding process may denote a method that electrically connects a bonding metal formed on an uppermost metal layer of the upper chip with a bonding metal formed on an uppermost metal layer of the lower chip. For example, when the bonding metals include Cu, the bonding process may be a Cu—Cu bonding process. The bonding metals may also include Al or W.

Each of a peripheral circuit region PERI and a cell region CELL of the memory device 4000 may include an external pad bonding area PA, a word line bonding area WLBA, and a bit line bonding area BLBA. The peripheral circuit region PERI may include a first substrate 4110, an interlayer insulating layer 4115, a plurality of circuit devices 4120*a*, 4120*b*, and 4120*c* formed on the first substrate 4110, first metal layers 4130*a*, 4130*b*, and 4130*c* respectively connected to the plurality of circuit devices 4120*a*, 4120*b*, and 4120*c*, and second metal layers 4140*a*, 4140*b*, and 4140*c* respectively formed on the first metal layers 4130*a*, 4130*b*, and 4130*c*. According to an embodiment, the first metal layers 4130*a*, 4130*b*, and 4130*c* may include W that has a relatively high resistance, and the second metal layers 4140*a*, 4140*b*, and 4140*c* may include Cu that has a relatively low resistance.

In this specification, only the first metal layers 4130*a*, 4130*b*, and 4130*c* and the second metal layers 4140*a*, 4140*b*, and 4140*c* are illustrated and described. However, the inventive concept is not limited thereto, and one or more metal layers may further be formed on the second metal layers 4140*a*, 4140*b*, and 4140*c*. At least one of the one or more metal layers formed on the second metal layers 4140*a*, 4140*b*, and 4140*c* may include Al, etc. that have a lower resistance than Cu included in the second metal layers 4140*a*, 4140*b*, and 4140*c*. The interlayer insulating layer 4115 may be arranged on the first substrate 4110 to cover the plurality of circuit devices 4120*a*, 4120*b*, and 4120*c*, the first metal layers 4130*a*, 4130*b*, and 4130*c*, and the second metal layers 4140*a*, 4140*b*, and 4140*c* and may include an insulating material, such as silicon oxide, silicon nitride, etc.

Lower bonding metals 4171*b* and 4172*b* may be formed on the second metal layer 4140*b* in the word line bonding area WLBA. In the word line bonding area WLBA, the lower bonding metals 4171*b* and 4172*b* of the peripheral circuit region PERI may be electrically connected to upper bonding metals 4271*b* and 4272*b* of the cell region CELL by a bonding process. Also, the lower bonding metals 4171*b* and 4172*b* and the upper bonding metals 4271*b* and 4272*b* may include Al, Cu, W, or the like.

The cell region CELL may provide at least one memory block. The cell region CELL may include a second substrate 4210 and a common source line 4220. A plurality of word lines 4230, namely, word lines 4231 to 4238, may be stacked on the second substrate 4210 in a direction (a Z axis direction) that is vertical to an upper surface of the second substrate 4210. String selection lines and a ground selection line may be respectively arranged above and below the word lines 4230, and the plurality of word lines 4230 may be arranged between the string selection lines and the ground selection line.

In the bit line bonding area BLBA, a channel structure CH may extend in the direction that is vertical to the upper surface of the second substrate 4210 and may penetrate through the word lines 4230, the string selection lines, and the ground selection line. The channel structure CH may include a data storage layer, a channel layer, a buried insulating layer, etc., and the channel layer may be electrically connected to a first metal layer 4250*c* and a second metal layer 4260*c*. For example, the first metal layer 4250*c* may be a bit line contact, and the second metal layer 4260*c* may be a bit line. According to an embodiment, the bit line may extend in a first direction (a Y axis direction) that is parallel to the upper surface of the second substrate 4210.

In the embodiment illustrated in FIG. 14, a region in which the channel structure CH and the bit line are arranged may be defined as the bit line bonding area BLBA. In the bit line bonding area BLBA, the bit line may be electrically connected to the circuit devices 4120*c* providing a page buffer 4293 in the peripheral circuit region PERI. For example, the bit line may be connected to upper bonding metals 4271*c* and 4272*c* in the peripheral circuit region PERI, and the upper bonding metals 4271*c* and 4272*c* may be connected to lower bonding metals 4171*c* and 4172*c* connected to the circuit devices 4120*c* of the page buffer 4293.

In the word line bonding area WLBA, the word lines 4230 may extend in a second direction (an X axis direction) that is parallel to the upper surface of the second substrate 4210 and may be connected to a plurality of cell contact plugs 4240, namely, cell contact plugs 4241 to 4247. The word lines 4230 and the cell contact plugs 4240 may be connected to each other in pads provided by one or more of the word lines 4230, the one or more of the word lines 4230 extending in the second direction as different lengths. A first metal layer 4250*b* and a second metal layer 4260*b* may be sequentially connected above the cell contact plugs 4240 connected to the word lines 4230. In the word line bonding area WLBA, the cell contact plugs 4240 may be connected to the peripheral circuit region PERI through the upper bonding metals 4271*b* and 4272*b* of the cell region CELL and the lower bonding metals 4171*b* and 4172*b* of the peripheral circuit region PERI.

The cell contact plugs 4240 may be electrically connected to the circuit devices 4120*b* providing a row decoder 4294 in the peripheral circuit region PERI. According to an embodiment, an operation voltage of the circuit devices 4120*b* providing the row decoder 4294 may be different from an operation voltage of the circuit devices 4120*c* providing the page buffer 4293. For example, the operation voltage of the circuit devices 4120*c* providing the page buffer 4293 may be greater than the operation voltage of the circuit devices 4120*b* providing the row decoder 4294.

A common source line contact plug 4280 may be arranged in the external pad bonding area PA. The common source line contact plug 4280 may include a conductive material, such as metal, a metal compound, polysilicon, or the like, and may be electrically connected to the common source line 4220. A first metal layer 4250*a* and a second metal layer 4260*a* may be sequentially stacked above the common source line contact plug 4280. For example, a region in which the common source line contact plug 4280, the first metal layer 4250*a*, and the second metal layer 4260*a* are arranged may be defined as the external pad bonding area PA.

First and second input and output pads 4105 and 4205 may be arranged in the external pad bonding area PA. Referring to FIG. 15, a lower insulating layer 4101 covering a lower surface of the first substrate 4110 may be formed below the first substrate 4110, and the first input and output pad 4105 may be formed on the lower insulating layer 4101. The first input and output pad 4105 may be connected to at least one of the plurality of circuit devices 4120*a*, 4120*b*, and 4120*c* arranged in the peripheral circuit region PERI through a first input and output contact plug 4103 and may be insulated from the first substrate 4110 through the lower insulating layer 4101. Also, a side surface insulating layer may be arranged between the first input and output contact plug 4103 and the first substrate 4110 to electrically separate the first input and output contact plug 4103 and the first substrate 4110 from each other.

Referring to FIG. 15, an upper insulating layer 4201 covering the upper surface of the second substrate 4210 may be formed above the second substrate 4210, and the second input and output pad 4205 may be arranged on the upper insulating layer 4201. The second input and output pad 4205 may be connected to at least one of the plurality of circuit devices 4120*a*, 4120*b*, and 4120*c* arranged in the peripheral circuit region PERI through a second input and output contact plug 4203.

According to embodiments, in a region in which the second input and output contact plug 4203 is arranged, the second substrate 4210, the common source line 4220, etc. may not be arranged. Also, the second input and output pad 4205 may not overlap the word lines 4230 in a third direction (a Z axis direction). Referring to FIG. 15, the second input and output contact plug 4203 may be separated from the second substrate 4210 in a direction that is parallel to the upper surface of the second substrate 4210 and may be connected to the second input and output pad 4205 by penetrating through the interlayer insulating layer 4215 of the cell region CELL.

According to embodiments, the first input and output pad 4105 and the second input and output pad 4205 may be selectively formed. For example, the memory device 4000 may include only the first input and output pad 4105 arranged above the first substrate 4110 or may include only the second input and output pad 4205 arranged above the second substrate 4210. Alternatively, the memory device 4000 may include both the first input and output pad 4105 and the second input and output pad 4205.

A metal pattern of an uppermost metal layer may be present as a dummy pattern or the uppermost metal layer may be empty in each of the external pad bonding area PA and the bit line bonding area BABA included in each of the cell region CELL and the peripheral circuit region PERI.

In the memory device 4000, in the external pad bonding area PA, a lower metal pattern 4176*a* having the same shape as an upper metal pattern 4272*a* of the cell region CELL may be formed on an uppermost metal layer of the peripheral circuit region PERI to correspond to the upper metal pattern 4272*a* formed on an uppermost metal layer of the cell region CELL. The lower metal pattern 4176*a* formed on the uppermost metal layer of the peripheral circuit region PERI may not be connected to an additional contact in the peripheral circuit region PERI. Similarly, in the external pad bonding area PA, to correspond to the lower metal pattern 4176*a* formed on the uppermost metal layer of the peripheral circuit region PERI, the upper metal pattern 4272*a* having the same shape as the lower metal pattern 4176*a* of the peripheral circuit region PERI may be formed on the uppermost metal layer of the cell region CELL.

Lower bonding metals 4171*b* and 4172*b* may be formed on the second metal layer 4140*b* in the word line bonding area WLBA. In the word line bonding area WLBA, the lower bonding metals 4171*b* and 4172*b* of the peripheral circuit area PERI may be electrically connected to the upper bonding metals 4271*b* and 4272*b* of the cell region CELL by a bonding process. Also, in the bit line bonding area BLBA, to correspond to a lower metal pattern 4152 formed on the uppermost metal layer of the peripheral circuit region PERI, an upper metal pattern 4292 having the same shape as the lower metal pattern 4152 of the peripheral circuit region PERI may be formed on the uppermost metal layer of the cell region CELL. A contact may not be formed on the upper metal pattern 4292 formed on the uppermost metal layer of the cell region CELL.

Although not wishing to be bound by any particular implementation and/or standard, the memory device, the memory controller, and the storage device according to the embodiments described above with reference to FIGS. 1 to 15 may be implemented to Toggle DDR 4.0 or post toggles after Toggle DDR 4.0.

While the inventive concept has been particularly shown and described with reference to example embodiments thereof, it will be understood that various changes in form and details may be made therein without departing from the spirit and scope of the following claims.

What is claimed is:

1. A memory device, comprising:

a memory chip configured to perform a phase calibration operation and a duty cycle correction operation, during a training section, said memory chip comprising:

a first loop circuit, including:

a phase detector configured to generate a first comparison signal by detecting a phase difference between a first signal and a second signal, which are received from external the memory chip;

a first counter configured to generate a delay signal in response to the first comparison signal; and a delay cell configured to perform the phase calibration operation on the first signal, in response to the delay signal; and a second loop circuit, including:

a phase generator configured to generate a second reverse signal in response to the second signal;

the phase detector configured to generate a second comparison signal by comparing a duty cycle of a first reverse signal received from external the memory chip with a duty cycle of the second reverse signal;

a second counter configured to generate a control signal in response to the second comparison signal; and a duty correction circuit (DCC) configured to perform the duty cycle correction operation on the second signal according to the control signal.

2. The memory device of claim 1, wherein the memory device is responsive to a clock signal, which operates as a read enable signal that toggles at a predetermined frequency during the training section.

3. The memory device of claim 1, wherein the first and second signals toggle at predetermined frequencies.

4. The memory device of claim 3, wherein the first and second signals correspond to data strobe signals.

5. The memory device of claim 3, wherein the first signal and the first reverse signal are out of phase from each other by 180 degrees; and wherein the second signal and the second reverse signal are out of phase from each other by 180 degrees.

6. The memory device of claim 1, wherein the memory chip is configured to sequentially perform the phase calibration operation and the duty cycle correction operation, in response to a DCC start command received from external the memory chip.

7. The memory device of claim 1, wherein the first loop circuit is configured to: detect the phase difference between the first signal and the second signal, generate the first comparison signal, generate the delay signal according to the first comparison signal, adjust a delay time of the first signal, and align phases of the first signal and the second signal.

8. The memory device of claim 1, wherein the second loop circuit is configured to: detect a phase difference between the first reverse signal and the second reverse signal, generate the second comparison signal, generate the control signal according to the second comparison signal, and perform the duty cycle correction operation to thereby adjust a duty cycle of the second signal.

9. A storage device, comprising:
- a controller configured to provide a first signal, a second signal, and a first reverse signal; and
- a memory device configured to perform a phase calibration operation and a duty cycle correction operation, said memory device comprising:
  - a phase detector configured to detect a phase difference between the first signal and the second signal;
  - a first counter configured to generate a delay signal, based on the phase difference;
  - a delay cell configured to receive the delay signal and perform a phase calibration operation on the first signal;
  - a phase generator configured to generate a second reverse signal, based on the second signal;
  - a second counter configured to, based on a difference generated by comparing a duty cycle of the first reverse signal with a duty cycle of the second reverse signal, generate a control signal; and
  - a duty correction circuit (DCC) configured to receive the control signal and perform a duty cycle correction operation on the second signal.

10. The storage device of claim 9,
- wherein the memory device comprises a plurality of memory chips; and
- wherein the memory device is electrically connected to the controller through a plurality of input and output pins including a first pin and a second pin, and is configured to receive a clock signal through the first pin and receive the first signal, the first reverse signal, and the second signal through the second pin.

11. The storage device of claim 10, wherein the clock signal is a read enable signal that toggles at a predetermined frequency during a training section.

12. The storage device of claim 9, wherein the first and second signals toggle at predetermined frequencies.

13. The storage device of claim 12, wherein the first and second signals correspond to data strobe signals.

14. The storage device of claim 9, wherein the memory device is configured to sequentially perform the phase calibration operation and the duty cycle correction operation, in response to a DCC start command received from the controller.

15. The storage device of claim 14, wherein the memory device is configured to:
- generate a first comparison signal by detecting a phase difference between the first signal and the second signal;
- generate the delay signal according to the first comparison signal; and
- adjust a delay time of the first signal to align phases of the first signal and the second signal.

16. The storage device of claim 14, wherein the memory device is configured to:
- generate a second comparison signal by detecting a phase difference between the first reverse signal and the second reverse signal;
- generate the control signal according to the second comparison signal; and
- perform the duty cycle correction operation to adjust a duty cycle of the second signal.

17. A memory device, comprising:
- a plurality of memory chips; and
- an interface chip configured to perform communication between a controller and the plurality of memory chips;
- wherein the interface chip comprises a first loop circuit configured to perform a phase calibration operation during a training section of the controller, and a second loop circuit configured to perform a duty cycle correction operation during the training section of the controller;
- wherein the first loop circuit comprises:
  - a phase detector configured to detect a phase difference between a first signal and a second signal, which are received from the controller, and generate a first comparison signal;
  - a first counter configured to generate a delay signal, based on the first comparison signal; and
  - a delay cell configured to perform the phase calibration operation on the first signal according to the delay signal; and
- wherein the second loop circuit comprises:
  - a phase generator configured to generate a second reverse signal based on the second signal;
  - the phase detector configured to compare a duty cycle of a first reverse signal received from the controller with a duty cycle of the second reverse signal and generate a second comparison signal;
  - a second counter configured to generate a control signal, based on the second comparison signal; and
  - a duty correction circuit (DCC) configured to perform the duty cycle correction operation on the second signal according to the control signal.

18. The memory device of claim 17, wherein the memory device is responsive to a clock signal, which operates as a read enable signal that toggles at a predetermined frequency during the training section; and wherein the first and second signals correspond to data strobe signals that toggle at predetermined frequencies.

19. The memory device of claim 17, wherein the interface chip is configured to sequentially perform the phase calibration operation and the duty cycle correction operation, in response to a DCC start command received from the controller.

20. The memory device of claim 17, wherein the first loop circuit is configured to:

detect the phase difference between the first signal and the second signal and generate the first comparison signal;

generate the delay signal according to the first comparison signal; and align phases of the first signal and the second signal by adjusting a delay time of the first signal; and wherein the second loop circuit is configured to:

generate the second comparison signal by detecting a phase difference between the first reverse signal and the second reverse signal;

generate the control signal according to the second comparison signal; and perform the duty cycle correction operation to adjust a duty cycle of the second signal.

* * * * *